(12) United States Patent
Yuan et al.

(10) Patent No.: US 11,037,502 B2
(45) Date of Patent: Jun. 15, 2021

(54) SHIFT REGISTER AND DRIVING METHOD THEREOF, GATE DRIVING CIRCUIT, ARRAY SUBSTRATE, AND DISPLAY DEVICE

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN); Enming Xie, Beijing (CN)

(73) Assignees: Hefei BOE Joint Technology Co., Ltd., Anjui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/642,973

(22) PCT Filed: Jul. 29, 2019

(86) PCT No.: PCT/CN2019/098230
§ 371 (c)(1),
(2) Date: Feb. 28, 2020

(87) PCT Pub. No.: WO2020/098309
PCT Pub. Date: May 22, 2020

(65) Prior Publication Data
US 2020/0394960 A1 Dec. 17, 2020

(30) Foreign Application Priority Data
Nov. 13, 2018 (CN) .......................... 201811345137.5

(51) Int. Cl.
*G09G 3/3266* (2016.01)
*G09G 3/3225* (2016.01)
(Continued)

(52) U.S. Cl.
CPC ......... *G09G 3/3266* (2013.01); *G09G 3/3225* (2013.01); *G09G 2300/0426* (2013.01);
(Continued)

(58) Field of Classification Search
CPC ............. G09G 2310/0286; G09G 3/20; G09G 3/3266; G09G 3/3225; G09G 3/36;
(Continued)

(56) References Cited

U.S. PATENT DOCUMENTS

| 2010/0085294 A1 | 4/2010 | Otose |
| 2017/0193950 A1* | 7/2017 | Kim .................. G09G 3/3677 |

(Continued)

FOREIGN PATENT DOCUMENTS

| CN | 101719382 A | 6/2010 |
| CN | 105551422 A | 5/2016 |

(Continued)

*Primary Examiner* — Dmitry Bolotin
(74) *Attorney, Agent, or Firm* — Arent Fox LLP; Michael Fainberg

(57) ABSTRACT

The present disclosure discloses a shift register and a driving method thereof, a gate driving circuit, an array substrate, and a display device. With a signal control circuit, a branch control circuit, a cascade signal output circuit and at least two scanning signal output circuits, each shift register can output at least two different scanning signals to correspond to different gate lines in an array substrate. This can reduce the number of shift registers in a gate drive circuit and the space occupied by the gate drive circuit and can achieve an ultra-narrow bezel design, as compared with an existing shift register that can only output one scan signal. Furthermore, as signals of different output control node do not influence each other, the stability of waveforms of the output scanning signals may also be improved, and a difference in the waveforms of the scanning signals is avoided.

18 Claims, 14 Drawing Sheets

(52) U.S. Cl.
CPC . *G09G 2300/08* (2013.01); *G09G 2310/0286* (2013.01); *G09G 2310/08* (2013.01)

(58) Field of Classification Search
CPC ......... G09G 3/3674; G09G 2300/0426; G09G 2300/08; G09G 2310/08; G11C 19/28
See application file for complete search history.

(56) References Cited

U.S. PATENT DOCUMENTS

| | | |
|---|---|---|
| 2018/0190180 A1 | 7/2018 | Shang et al. |
| 2019/0304393 A1* | 10/2019 | Wang .................... G09G 3/3677 |
| 2019/0371422 A1* | 12/2019 | Wang .................... G09G 3/3266 |
| 2019/0392916 A1 | 12/2019 | Gu et al. |
| 2020/0074933 A1* | 3/2020 | Ban ....................... G09G 3/3291 |
| 2020/0074937 A1* | 3/2020 | Choi ..................... G09G 3/3266 |
| 2020/0168162 A1* | 5/2020 | Feng ..................... G09G 3/3266 |

FOREIGN PATENT DOCUMENTS

| | | | | |
|---|---|---|---|---|
| CN | 105632562 A | | 6/2016 | |
| CN | 106531051 A | | 3/2017 | |
| CN | 106782267 A | * | 5/2017 | ............... G09G 3/20 |
| CN | 106782267 A | | 5/2017 | |
| CN | 107123390 A | | 9/2017 | |
| CN | 107403612 A | * | 11/2017 | ........... G09G 3/3677 |
| CN | 107945759 A | | 4/2018 | |
| CN | 108597437 A | | 9/2018 | |

* cited by examiner

SHIFT REGISTER AND DRIVING METHOD THEREOF, GATE DRIVING CIRCUIT, ARRAY SUBSTRATE, AND DISPLAY DEVICE

CROSS REFERENCE TO RELATED APPLICATIONS

The present application is a US National Stage of International Application No. PCT/CN2019/098230, filed Jul. 29, 2019, which claims priority to Chinese Patent Application No. 201811345137.5 filed with Chinese Patent Office on Nov. 13, 2018, and entitled "Shift Register and Driving Method Thereof, and Gate Driving Circuit and Relevant Devices", which is hereby incorporated by reference in its entirety.

FIELD

The present disclosure relates to the field of displaying, and particularly to a shift register and a driving method thereof, a gate driving circuit, an array substrate, and a display device.

BACKGROUND

With the rapid development of display technologies, display panels are increasingly developed toward high integration and low cost. A gate driver on array (GOA) technology integrates a thin film transistor (TFT) gate driving circuit on an array substrate of a display panel to form a scanning driver for the display panel, thereby eliminating a wiring space for a bonding region and a fan-out region of a gate integrated circuit (IC). The general gate driving circuit includes a plurality of cascaded shift registers, and each stage of shift register is connected to one corresponding gate line, so as to sequentially input a scanning signal to each row of gate line on the display panel through each stage of shift register. However, since the gate line in each row is correspondingly connected to one shift register, the gate driving circuit is complicated in structural design, and occupies a larger space of the display panel, thereby being not conducive to a narrow-bezel design.

SUMMARY

An embodiment of the present disclosure provides a shift register. The shift register includes: a signal control circuit, coupled to an input signal terminal and a reset signal terminal; a branch control circuit, coupled to a first output terminal of the signal control circuit; a cascade signal output circuit, coupled to a cascade signal output terminal and a second output terminal of the signal control circuit; and at least two scanning signal output circuits, wherein one of the at least two scanning signal output circuits is coupled to the second output terminal of the signal control circuit, at least one corresponding scanning signal output terminal, and one corresponding output terminal of the branch control circuit.

Optionally, in the embodiment of the present disclosure, the cascade signal output circuit is coupled to the first output terminal of the signal control circuit.

Optionally, in the embodiment of the present disclosure, the at least two scanning signal output circuits include two scanning signal output circuits, which are a first scanning signal output circuit, and a second scanning signal output circuit. The first scanning signal output circuit is coupled to a first output terminal of the branch control circuit, and the second scanning signal output circuit is coupled to a second output terminal of the branch control circuit.

Optionally, in the embodiment of the present disclosure, the branch control circuit includes: a first transistor and a second transistor. The first transistor is configured to connect the first output terminal of the signal control circuit with the first output terminal of the branch control circuit under control of an active level, and the second transistor is configured to connect the first output terminal of the signal control circuit with the second output terminal of the branch control circuit under control of the active level.

Optionally, in the embodiment of the present disclosure, a gate and a first electrode of the first transistor are both coupled to the first output terminal of the signal control circuit, and a second electrode of the first transistor is the first output terminal of the branch control circuit; and a gate and a first electrode of the second transistor are both coupled to the first output terminal of the signal control circuit, and a second electrode of the second transistor is the second output terminal of the branch control circuit.

Optionally, in the embodiment of the present disclosure, the gate of the first transistor is coupled to a first reference signal terminal. The first electrode of the first transistor is coupled to the first output terminal of the signal control circuit, and the second electrode of the first transistor is the first output terminal of the branch control circuit; and the gate of the second transistor is coupled to the first reference signal terminal, the first electrode of the second transistor is coupled to the first output terminal of the signal control circuit, and the second electrode of the second transistor is the second output terminal of the branch control circuit.

Optionally, in the embodiment of the present disclosure, the first scanning signal output circuit includes: at least one first subscanning signal output circuit, wherein one first subscanning signal output circuit is coupled to a second reference signal terminal, one corresponding first clock signal terminal, and one corresponding first subscanning signal output terminal.

Optionally, in the embodiment of the present disclosure, the first subscanning signal output circuit includes: a third transistor, a fourth transistor, and a first capacitor; a gate of the third transistor is coupled to the first output terminal of the branch control circuit, a first electrode of the third transistor is coupled to the first clock signal terminal, and a second electrode of the third transistor is coupled to the corresponding first subscanning signal output terminal; a gate of the fourth transistor is coupled to the second output terminal of the signal control circuit, a first electrode of the fourth transistor is coupled to the second reference signal terminal, and a second electrode of the fourth transistor is coupled to the corresponding first subscanning signal output terminal; and the first capacitor is coupled between the gate of the third transistor and the first subscanning signal output terminal.

Optionally, in the embodiment of the present disclosure, the second scanning signal output circuit includes: at least one second subscanning signal output circuit, wherein one second subscanning signal output circuit is coupled to the second reference signal terminal, one corresponding second clock signal terminal, and one corresponding second subscanning signal output terminal.

Optionally, in the embodiment of the present disclosure, the second subscanning signal output circuit includes: a fifth transistor, a sixth transistor, and a second capacitor; a gate of the fifth transistor is coupled to the second output terminal of the branch control circuit, a first electrode of the fifth transistor is coupled to the second clock signal terminal, and a second electrode of the fifth transistor is coupled to the corresponding second subscanning signal output terminal; a gate of the sixth transistor is coupled to the second output terminal of the signal control circuit, a first electrode of the sixth transistor is coupled to the second reference signal terminal, and a second electrode of the sixth transistor is coupled to the corresponding second subscanning signal output terminal; and the second capacitor is coupled between the gate of the fifth transistor and the second subscanning signal output terminal.

Optionally, in the embodiment of the present disclosure, the cascade signal output circuit includes: a seventh transistor, an eighth transistor, and a third capacitor; a gate of the seventh transistor is coupled to the first output terminal of the signal control circuit, a first electrode of the seventh transistor is coupled to a third clock signal terminal, and a second electrode of the seventh transistor is coupled to the cascade signal output terminal; a gate of the eighth transistor is coupled to the second output terminal of the signal control circuit, a first electrode of the eighth transistor is coupled to a third reference signal terminal, and a second electrode of the eighth transistor is coupled to the cascade signal output terminal; and the third capacitor is coupled between the gate of the seventh transistor and the cascade signal output terminal.

Optionally, in the embodiment of the present disclosure, the signal control circuit includes: an input circuit, a reset circuit, and a node control circuit. The input circuit is coupled to the input signal terminal, the first reference signal terminal, and the first output terminal of the signal control circuit; the reset circuit is coupled to the reset signal terminal, the third reference signal terminal, and the first output terminal and the second output terminal of the branch control circuit; and the node control circuit is coupled to the third reference signal terminal, the first output terminal and the second output terminal of the signal control circuit, and the first output terminal and the second output terminal of the branch control circuit.

Optionally, in the embodiment of the present disclosure, the input circuit includes: a ninth transistor, wherein a gate of the ninth transistor is coupled to the input signal terminal, a first electrode of the ninth transistor is coupled to the first reference signal terminal, and a second electrode of the ninth transistor is coupled to the first output terminal of the signal control circuit; the reset circuit includes: a tenth transistor and an eleventh transistor, wherein a gate of the tenth transistor is coupled to the reset signal terminal, a first electrode of the tenth transistor is coupled to the third reference signal terminal, and a second electrode of the tenth transistor is coupled to the first output terminal of the branch control circuit; and a gate of the eleventh transistor is coupled to the reset signal terminal, a first electrode of the eleventh transistor is coupled to the third reference signal terminal, and a second electrode of the eleventh transistor is coupled to the second output terminal of the branch control circuit; and the node control circuit includes: a twelfth transistor, a thirteenth transistor, and an inverter, wherein a gate of the twelfth transistor is coupled to the second output terminal of the signal control circuit, a first electrode of the twelfth transistor is coupled to the third reference signal terminal, and a second electrode of the twelfth transistor is coupled to the first output terminal of the branch control circuit; a gate of the thirteenth transistor is coupled to the second output terminal of the signal control circuit, a first electrode of the thirteenth transistor is coupled to the third reference signal terminal, and a second electrode of the thirteenth transistor is coupled to the second output terminal of the branch control circuit; an input terminal of the inverter is coupled to the first output terminal of the signal control circuit, and an output terminal of the inverter is coupled to the second output terminal of the signal control circuit.

Optionally, in the embodiment of the present disclosure, the reset circuit further includes: a fourteenth transistor, wherein the first electrode of the tenth transistor and the first electrode of the eleventh transistor are respectively coupled to the third reference signal terminal through the fourteenth transistor, and a gate of the fourteenth transistor is coupled to the reset signal terminal; and the node control circuit further includes: a fifteenth transistor, wherein the first electrode of the twelfth transistor and the first electrode of the thirteenth transistor are respectively coupled to the third reference signal terminal through the fifteenth transistor, and a gate of the fifteenth transistor is coupled to the second output terminal of the signal control circuit.

Optionally, in the embodiment of the present disclosure, the shift register further includes: a detection circuit. The detection circuit includes: a sixteenth transistor, a seventeenth transistor, an eighteenth transistor, a nineteenth transistor, a twentieth transistor, and a fourth capacitor; a gate of the sixteenth transistor is coupled to a first detection control signal, a first electrode of the sixteenth transistor is coupled to the input signal terminal, and a second electrode of the sixteenth transistor is coupled to a first electrode of the eighteenth transistor; a gate of the seventeenth transistor is coupled to the first detection control signal, a first electrode of the seventeenth transistor is coupled to a gate of the nineteenth transistor, and a second electrode of the seventeenth transistor is coupled to the first electrode of the eighteenth transistor; a gate of the eighteenth transistor is coupled to the gate of the nineteenth transistor, and a second electrode of the eighteenth transistor is coupled to a fourth reference signal terminal; a first electrode of the nineteenth transistor is coupled to the fourth reference signal terminal, and a second electrode of the nineteenth transistor is coupled to a first electrode of the twentieth transistor; a gate of the twentieth transistor is coupled to a second detection control signal terminal, and a second electrode of the twentieth transistor is coupled to the first output terminal of the signal control circuit; and the fourth capacitor is coupled between the first electrode of the nineteenth transistor and the gate of the nineteenth transistor.

Correspondingly, an embodiment of the present disclosure further provides a gate driving circuit, including a plurality of the cascaded shift registers provided by the embodiment of the present disclosure; an input signal terminal of a first-stage shift register is coupled to a frame start signal terminal; in every four adjacent stages of shift registers, an input signal terminal of a fourth-stage shift register is coupled to a cascade signal input terminal of the first-stage shift register; and in every five adjacent stages of shift registers, a reset signal terminal of the first-stage shift register is coupled to a cascade signal input terminal of a fifth-stage shift register.

Correspondingly, an embodiment of the present disclosure further provides an array substrate including the gate driving circuit according to the embodiment of the present disclosure.

Correspondingly, the embodiment of the present disclosure further provides a display device, including the array substrate according to the embodiment of the present disclosure.

Correspondingly, an embodiment of the present disclosure further provides a driving method of the shift register according to the embodiment of the present disclosure. The driving method includes: a display scanning period, the display scanning period includes: an input period, an output period, and a reset period; in the input period, the signal control circuit controls a signal of the first output terminal of the signal control circuit and a signal of the second output terminal of the signal control circuit in response to a signal of the input signal terminal; the branch control circuit controls output signals of the output terminals of the branch control circuit in response to the signal of the first output terminal of the signal control circuit; the cascade signal output circuit controls the cascade signal output terminal to output a cascade signal in response to the signal of the first output terminal of the signal control circuit. The scanning signal output circuits control at least one corresponding scanning signal output terminal to output different scanning signals in response to signals of corresponding output terminals of the branch control circuit. In the output period, the branch control circuit controls output signals of the output terminals of the branch control circuit in response to the signal of the first output terminal of the signal control circuit. The cascade signal output circuit controls the cascade signal output terminal to output a cascade signal in response to the signal of the first output terminal of the signal control circuit. The scanning signal output circuits control at least one corresponding scanning signal output terminal to output different scanning signals in response to signals of corresponding output terminals of the branch control circuit. In the reset period, the signal control circuit controls the signal of the first output terminal of the signal control circuit and the signal of the second output terminal of the signal control circuit in response to a signal of the reset signal terminal. The cascade signal output circuit controls the cascade signal output terminal to output the cascade signal in response to the signal of the first output terminal of the signal control circuit. The scanning signal output circuits control at least one corresponding scanning signal output terminal to output different scanning signals in response to signals of corresponding output terminals of the branch control circuit.

Optionally, in the embodiment of the present disclosure, the scanning signal output circuits include two scanning signal output circuits, which are a first scanning signal output circuit and a second scanning signal output circuit. The first scanning signal output circuit includes: a plurality of first subscanning signal output circuits, and the second scanning signal output circuit includes: a plurality of second subscanning signal output circuits. In the input period and the output period, the first subscanning signal output circuit provides a signal of the corresponding first clock signal terminal to one corresponding first subscanning signal output terminal in response to the signal of the first output terminal of the branch control circuit, the second subscanning signal output circuit provides a signal of the corresponding second clock signal terminal to one corresponding second subscanning signal output terminal in response to the signal of the second output terminal of the branch control circuit, and the cascade signal output circuit provides a signal of the third clock signal terminal to the cascade signal output terminal in response to the signal of the first output terminal of the signal control circuit. In the reset period, the first subscanning signal output circuit provides a signal of the second reference signal terminal to the corresponding first subscanning signal output terminal in response to the signal of the second output terminal of the signal control circuit, the second subscanning signal output circuit provides the signal of the second reference signal terminal to the corresponding second subscanning signal output terminal in response to the signal of the second output terminal of the signal control circuit, and the cascade signal output circuit provides a signal of the third reference signal terminal to the cascade signal output terminal in response to the signal of the second output terminal of the signal control circuit.

Optionally, in the embodiment of the present disclosure, in the display scanning period, signal timings of the first clock signal terminals are the same, signal timings of the second clock signal terminals are the same, and the signal timings of the first clock signal terminals and the signal timings of the second clock signal terminals are different.

Optionally, in the embodiment of the present disclosure, signal cycles of the first clock signal terminal, the second clock signal terminal and the third clock signal terminal are the same. In a same signal cycle, a signal rising edge of the third clock signal terminal appears before a signal rising edge of the second clock signal terminal, and a signal falling edge of the third clock signal terminal appears after a signal falling edge of the first clock signal terminal.

DETAILED DESCRIPTION

Figure 1:
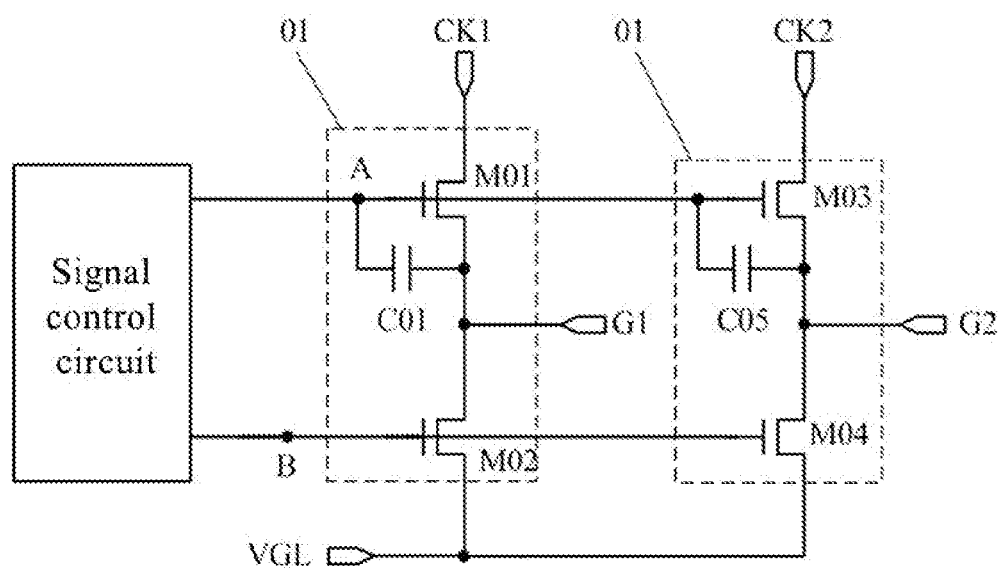
FIG. 1 is a schematic structural diagram of a shift register in the related art.

In order to make the objects, technical solutions and advantages of the present disclosure clearer, the implementations of a shift register and a driving method thereof, a gate driving circuit, and a display device according to embodiments of the present disclosure are described below in detail in combination with the accompanying drawings. It should be understood that the preferred embodiments described below are merely to illustrate and explain the present disclosure, and not intended to limit the present disclosure. Furthermore, the embodiments in the present disclosure and features in the embodiments may be combined with each other under the condition of no confliction. It should be noted that shapes in the accompanying drawings do not reflect real proportions, and are merely to illustrate the contents of the present disclosure. Furthermore, same or similar reference numerals throughout indicate same or similar elements or elements with same or similar functions.

Figure 2:
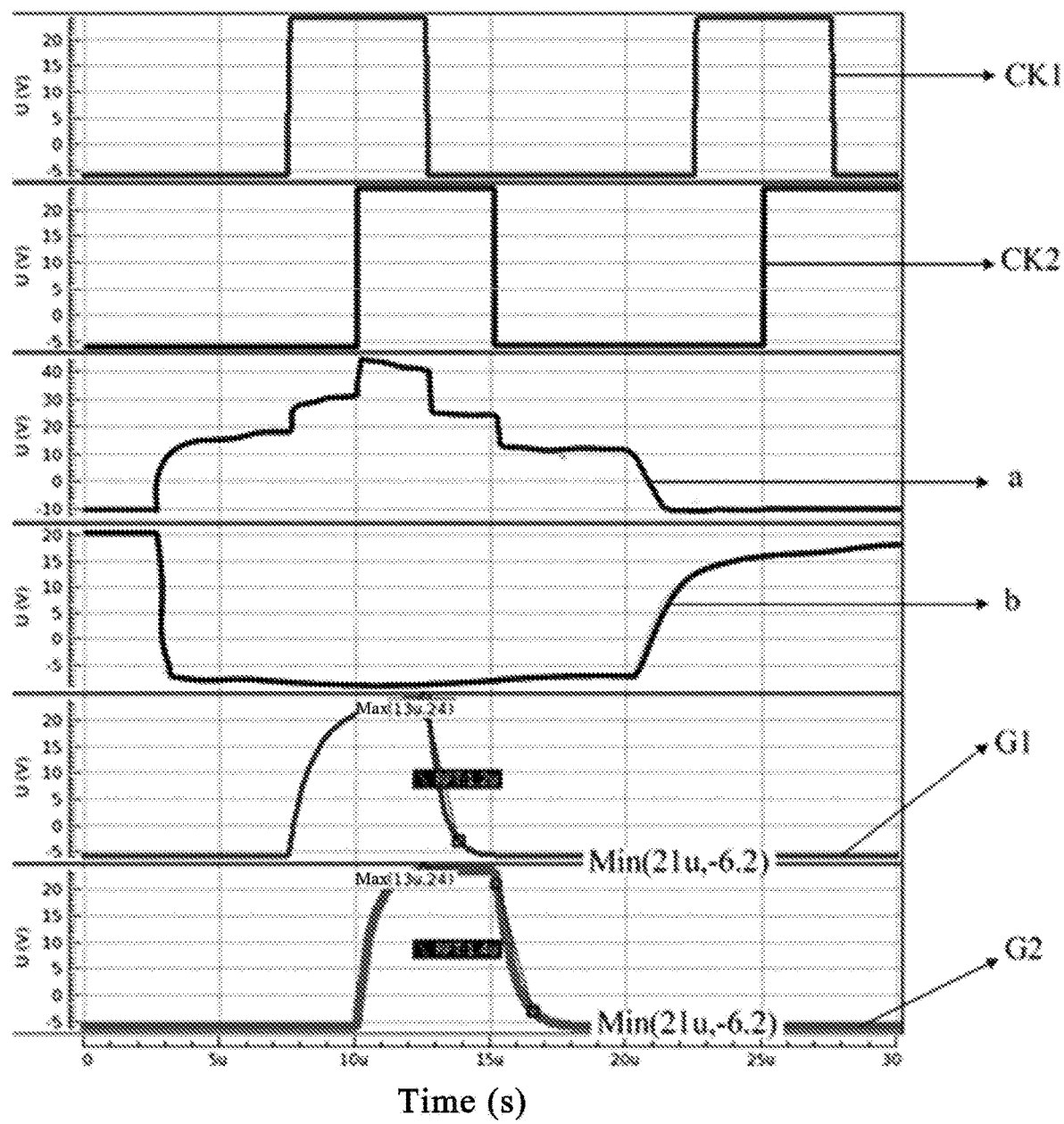
FIG. 2 is a simulation signal diagram of the shift register shown in FIG. 1.

As shown in FIG. 1, in order to output a plurality of scanning signals, a shift register may include a plurality of scanning signal output circuits 01. For example, in FIG. 1, two scanning signal output circuits 01 are provided, wherein one scanning signal output circuit 01 outputs a scanning signal G1, and the other scanning signal output circuit 01 outputs a scanning signal G2. Specifically, a signal of a pull-up node A and a signal of a pull-down node B are controlled through a signal control circuit. The scanning signal output circuit 01 that outputs the scanning signal G1 includes transistors M01 and M02, and a capacitor C01, wherein a gate of the transistor M01 is coupled to the pull-up node A, a first electrode of the transistor M01 is configured to receive a clock signal CK1, and a second electrode of the transistor M01 is configured to output the scanning signal G1. A gate of the transistor M02 is coupled to the pull-down node B, a first electrode of the transistor M02 is configured to receive a signal VGL, and a second electrode of the transistor M02 is coupled to the second electrode of the transistor M01. The capacitor C01 is coupled between the pull-up node A and the second electrode of the transistor M01. The scanning signal output circuit 01 that outputs the scanning signal G2 includes: transistors M03 and M04, and a capacitor C02, wherein a gate of the transistor M03 is coupled to the pull-up node A, a first electrode of the transistor M03 is configured to receive a clock signal CK2, and a second electrode of the transistor M03 is configured to output the scanning signal G2. A gate of the transistor M04 is coupled to the pull-down node B, a first electrode of the transistor M04 is configured to receive the signal VGL, and a second electrode of the transistor M04 is coupled to the second electrode of the transistor M03. The capacitor C02 is coupled between the pull-up node A and the second electrode of the transistor M03. The transistor M01 may provide a signal of the clock signal CK1 to a second terminal of the transistor M01 under control of a signal of the pull-up node A, and the clock signal CK1 is output as the scanning signal G1. The transistor M03 may provide a signal of the clock signal CK2 to a second terminal thereof under control of the signal of the pull-up node A, and the clock signal CK2 is output as the scanning signal G2. A simulation timing diagram may be obtained by simulating the clock signals CK1 and CK2, the signal a of the pull-up node A, the signal b of the pull-down node B, and the scanning signals G1 and G2, as shown in FIG. 2. Since a high level of the clock signal CK1 appears earlier than a high level of the clock signal CK2, the transistor M01 is turned on under control of the signal of the pull-up node A, to pull up the level of the pull-up node A when the high-level signal of the clock signal CK1 is output as the scanning signal G1. The transistor M03 is turned on under control of the signal of the pull-up node A, to further pull up the level of the pull-up node A when the high-level signal of the clock signal CK2 is output as the scanning signal G2. The transistor M01 and the transistor M03 are both controlled by the signal of the same pull-up node A, and the high level of the clock signal CK1 is preferentially converted into a low level, and as a result, the fall time RFT (12 us) of the scanning signal G1 recovered from the high level to the low level is shorter than the fall time RFT (14 us) of the scanning signal G2 recovered from the high level to the low level, thereby resulting in differences between waveforms of the output scanning signals G1 and G2.

Figure 3:
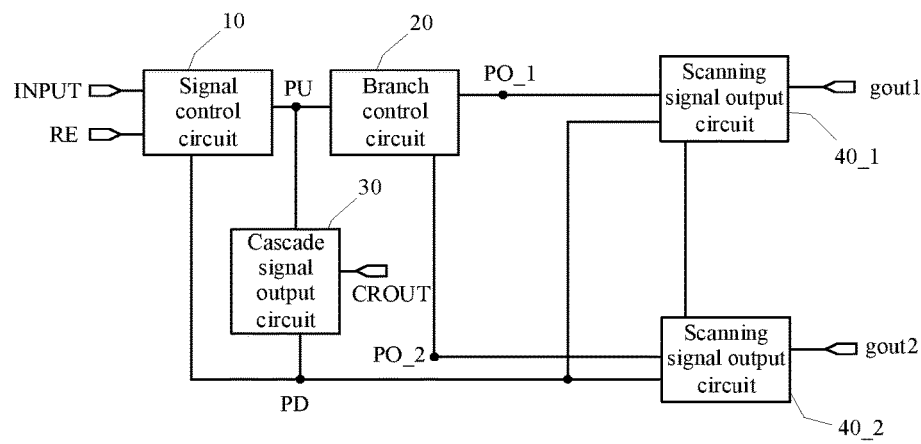
FIG. 3 is a schematic structural diagram of a shift register in accordance with an embodiment of the present disclosure.

Based on the above contents, an embodiment of the present disclosure provides a shift register, as shown in FIG. 3. The shift register may include a signal control circuit 10, a branch control circuit 20, a cascade signal output circuit 30, and at least two scanning signal output circuits 40_m (1≤m≤M, wherein M denotes a total number of the scanning signal output circuits. FIG. 3 takes M being equal to 2 as an example).

The signal control circuit 10 is coupled to an input signal terminal INPUT and a reset signal terminal RE, that is, the signal control circuit 10 is configured to control signals of a first output terminal and a second output terminal of the signal control circuit 10 in response to an input signal INPUT and a reset signal RE. For the sake of convenience in description, the first output terminal of the signal control circuit 10 is denoted by a signal of a first node PU, and the second output terminal of the signal control circuit 10 is denoted by a signal of a second node PD.

The branch control circuit 20 is coupled to the first output terminal of the signal control circuit 10, that is, the branch control circuit 20 is configured to control signals of output control nodes PO_m one-to-one corresponding to the scanning signal output circuits 40_m in response to the signal of the first node PU. For the sake of convenience in description, output terminals of the branch control circuit 20 are denoted by the output control nodes PO_m.

The cascade signal output circuit 30 is coupled to a cascade signal output terminal CROUT, and the first output terminal and the second output terminal of the signal control circuit 10, that is, the cascade signal output circuit 30 is configured to output a cascade signal CR in response to the signals of the first node PU and the second node PD. That is, the cascade signal output circuit 30 is directly coupled to the first output terminal of the signal control circuit 10 without the branch control circuit 20.

Each scanning signal output circuit 40_m is coupled to the second output terminal of the signal control circuit 10, at least one corresponding scanning signal output terminal goutm, and one corresponding output terminal of the branch control circuit 20. That is, each scanning signal output circuit 40_m is configured to output different scanning signal goutm in response to the signal of the corresponding output control node PO_m and the signal of the second node PD.

The shift register according to the embodiment of the present disclosure, the signal control circuit controls the signal of the first node and the signal of the second node in response to the signals of the input signal terminal and the reset signal terminal. Since the branch control circuit is configured to control the signals of the output control nodes which one-to-one corresponds to the scanning signal output circuits in response to the signal of the first node, the different output control nodes may be separated, and therefore, the variation of the signal of one output control node may not affect the signals of other output control nodes. In response to the signals of the first node and the second node, the cascade signal output circuit outputs the cascade signal to provide an input signal to the next stage of shift register. Through the arrangement of the plurality of scanning signal output circuits, the scanning signal output circuits output different scanning signals in response to the signals of the corresponding output control nodes and the signal of the second node. In this way, each shift register may output a plurality of scanning signals which correspond to different gate lines in an array substrate. Compared with the shift register in the related art, which may only output one scanning signal, the shift register in the present disclosure may has the advantages that the number of the shift registers in a gate driving circuit is reduced, an occupation space of the gate driving circuit is reduced, and an ultra-narrow-bezel design is realized; and furthermore, the signals of the different output control nodes do not affect each other, so that the stability of the waveforms of the output scanning signals may also be improved, and the differences in the waveforms of the scanning signals are avoided.

During specific implementation, in the embodiment of the present disclosure, the first node PU may be a pull-up node, and the second node PD may be a pull-down node.

Figure 4:
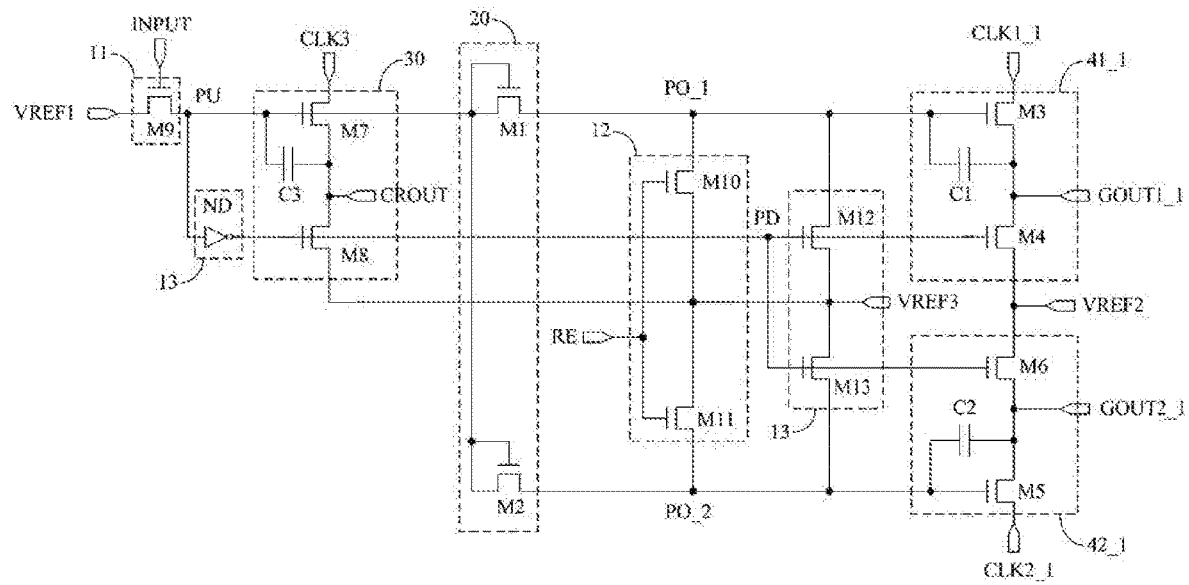
FIG. 4 is a specific schematic structural diagram of a shift register in accordance with an embodiment of the present disclosure.

During specific implementation, in the embodiment of the present disclosure, as shown in FIG. 4, the signal control circuit 10 may include an input circuit 11, a reset circuit 12, and a node control circuit 13. In this way, levels of the signals of the first node PU, the output control nodes PO_m and the second node PD may be controlled by cooperation of the input circuit 11, the reset circuit 12, and the node control circuit 13. The input circuit 11 is coupled to the input signal terminal INPUT, a first reference signal terminal VREF1, and the first output terminal of the signal control circuit, and the input circuit 11 is configured to provide a signal of the first reference signal terminal VREF1 to the first node PU in response to the signal of the input signal terminal INPUT. The reset circuit 12 is coupled to the reset signal terminal RE, a third reference signal terminal VREF3, and the first output terminal and the second output terminal of the branch control circuit 20, and the reset circuit 12 is configured to provide a signal of the third reference signal terminal VREF3 to the output control nodes PO_m corresponding to the scanning signal output circuits 40_m in response to the signal of the reset signal terminal RE. The node control circuit 13 is coupled to the first reference signal terminal VREF1, the third reference signal terminal VREF3, the first output terminal and the second output terminal of the signal control circuit 10, and the first output terminal and the second output terminal of the branch control circuit 20, and the node control circuit 13 is configured to control the signal of the first node PU and the signals of the output control nodes PO_m to be respectively opposite to the level of the signal of the second node PD.

During specific implementation, in the embodiment of the present disclosure, as shown in FIG. 4, the cascade signal output circuit 30 is configured to provide a signal of a third clock signal terminal CLK3 to the cascade signal output terminal CROUT in response to the signal of the first node PU, and provide the signal of the third reference signal terminal VREF3 to the cascade signal output terminal CROUT in response to the signal of the second node PD.

The present disclosure is described in detail below in combination of specific embodiments. It should be noted that the present embodiment is to better explain the present disclosure, and not intended to limit the present disclosure.

Embodiment I

During specific implementation, in the embodiment of the present disclosure, as shown in FIG. 3 and FIG. 4, two scanning signal output circuits 40_m may be configured, or, three, four, five and other numbers of scanning signal output circuits 40_m may also be configured. Of course, in actual application, the number of the scanning signal output circuits 40_m may be designed and determined according to an actual application environment, which is not limited herein. Two scanning signal output circuits 40_m are taken as an example for illustration below.

During specific implementation, in the embodiment of the present disclosure, as shown in FIG. 4, a first scanning signal output circuit 40_1 in the two scanning signal output circuits may include at least one first subscanning signal output circuit 41_n ($1 \leq n \leq N$, wherein N denotes a total number of the first subscanning signal output circuits, and in FIG. 4, N being equal to 1 is taken as an example). One first subscanning signal output circuit 41_n is coupled to a second reference signal terminal VREF2, one corresponding first clock signal terminal CLK1_n, and one corresponding first subscanning signal output terminal GOUT1_n respectively. The first subscanning signal output circuits 41_n one-to-one correspond to the first clock signal terminals CLK1_n, and the first subscanning signal output circuits 41_n one-to-one correspond to the first subscanning signal output terminals GOUT1_n. Furthermore, the first subscanning signal output circuit 41_n is configured to respond to the signal of the same output control node, that is, the first subscanning signal output circuit 41_n is configured to provide a signal of the corresponding first clock signal terminal CLK1_n to the corresponding first subscanning signal output terminal GOUT1_n in response to a signal of an output control node PO_1; and provide a signal of the second reference signal terminal VREF2 to the corresponding first subscanning signal output terminal GOUT1_n in response to a signal of a second node PD. Furthermore, the first subscanning signal output terminal GOUT1_n outputs a scanning signal gout1_n.

Further, during specific implementation, as shown in FIG. 4, one first subscanning signal output circuit may be set, or two first subscanning signal output circuits may be set. In actual application, the specific number of the first subscanning signal output circuits may be designed and determined according to an actual application environment, which is not limited herein. One first subscanning signal output circuit is taken as an example for illustration below.

During specific implementation, in the embodiment of the present disclosure, as shown in FIG. 4, a second scanning signal output circuit 40_2 in the two scanning signal output circuits may include: at least one second subscanning signal output circuit 42_k ($1 \leq k \leq K$, wherein K denotes a total number of the second subscanning signal output circuits, and in FIG. 4, K is equal to 1). One second subscanning signal output circuit 42_k is coupled to the second reference signal terminal VREF2, one corresponding second clock signal terminal CLK2_k, and one corresponding second subscanning signal output terminal respectively. The second subscanning signal output circuits 42_k one-to-one correspond to the second clock signal terminals CLK2_k, and the second subscanning signal output circuits 42_k one-to-one correspond the second subscanning signal output terminals GOUT2_k. Furthermore, the second subscanning signal output circuits 42_k are configured to respond to a signal of a same output control node, that is, each second subscanning signal output circuit 42_k is configured to provide a signal of the corresponding second clock signal terminal CLK2_k to the corresponding second subscanning signal output terminal GOUT2_k in response to a signal of an output control node PO_2; and provide the signal of the second reference signal terminal VREF2 to the corresponding second subscanning signal output terminal GOUT2_k in response to the signal of the second node PD. Furthermore, the second subscanning signal output terminal GOUT2_k outputs a scanning signal gout2_k.

Further, during specific implementation, as shown in FIG. 4, one second subscanning signal output circuit may be set, or two second subscanning signal output circuits may be set. In actual application, the number of the second subscanning signal output circuits may be designed and determined according to an actual application environment, which is not limited herein. One second subscanning signal output circuit is taken as an example for illustration below.

Further, during specific implementation, in the embodiment of the present disclosure, N may be equal to K, and n may be equal to k.

During specific implementation, in the embodiment of the present disclosure, as shown in FIG. 4, the branch control circuit 20 may include a first transistor M1 and a second transistor M2. The first transistor M1 is configured to connect the first output terminal of the signal control circuit 10 to the first output terminal of the branch control circuit 20 under control of an active level, and the second transistor M2 is configured to connect the first output terminal of the signal control circuit 10 to the second output terminal of the branch control circuit 20 under control of the active level.

Specifically, a gate and a first electrode of the first transistor M1 are both coupled to the first node PU, and a second electrode of the first transistor M1 is coupled to the output control node PO_1 corresponding to the first scanning signal output circuit 40_1 in the two scanning signal output circuits. A gate and a first electrode of the second transistor M2 are both coupled to the first node PU, and a second electrode of the second transistor M2 is coupled to the output control node PO_2 corresponding to the second scanning signal output circuit 40_2 in the two scanning signal output circuits.

During specific implementation, the gate of the first transistor M1 is coupled to the first electrode of the first transistor M1, so that the first transistor M1 forms a diode connection. In this way, when the voltage of the gate of the first transistor M1 is larger than the voltage of the second electrode of the transistor M1, the first transistor M1 may be turned on to enable the first node PU to be connected to the output control node PO_1; and when the voltage of the gate of the first transistor M1 is not larger than the voltage of the second electrode of the first transistor M1, the first transistor M1 may be turned off to enable the first node PU to be disconnected from the output control node PO_1. Similarly, when the voltage of the gate of the second transistor M2 is larger than the voltage of the second electrode of the second transistor M2, the second transistor M2 may be turned on to enable the first node PU to be connected to the output control node PO_2; and when the voltage of the gate of the second transistor M2 is not larger than the voltage of the second electrode of the second transistor M2, the second transistor M2 may be turned off to enable the first node PU to be disconnected from the output control node PO_2.

During specific implementation, in the embodiment of the present disclosure, as shown in FIG. 4, the first subscanning signal output circuit 41_n may include: a third transistor M3, a fourth transistor M4, and a first capacitor C1. A gate of the third transistor M3 is coupled to the corresponding output control node PO_1, a first electrode of the third transistor M3 is configured to receive the signal of the corresponding first clock signal terminal CLK1_n, and a second electrode of the third transistor M3 is coupled to the corresponding first subscanning signal output terminal GOUT1_n. A gate of the fourth transistor M4 is coupled to the second node PD, a first electrode of the fourth transistor M4 is configured to receive the signal of the second reference signal terminal VREF2, and a second electrode of the fourth transistor M4 is coupled to the corresponding first subscanning signal output terminal GOUT1_n. The first capacitor C1 is coupled between the gate of the third transistor M3, i.e., the corresponding output control node PO_1, and the first subscanning signal output terminal GOUT1_n.

During specific implementation, in the embodiment of the present disclosure, the third transistor M3 in each first subscanning signal output circuit 41_n may be turned on under control of the signal of the output control node PO_1, so as to provide the signal of the corresponding first clock signal terminal CLK1_n to the corresponding first subscanning signal output terminal GOUT1_n. The fourth transistor M4 in each first subscanning signal output circuit 41_n may be turned on under control of the signal of the second node PD, so as to provide the signal of the second reference signal terminal VREF2 to the corresponding first subscanning signal output terminal GOUT1_n. The first capacitor C1 may maintain the level of the connected output control node PO_1 and the level of the first subscanning signal output terminal GOUT1_n, and may maintain the stability of a voltage difference between the output control node PO_1 and the first subscanning signal output terminal GOUT1_n when the output control node PO_1 is floating.

During specific implementation, in the embodiment of the present disclosure, as shown in FIG. 4, the second subscanning signal output circuit 42_k may include a fifth transistor M5, a sixth transistor M6, and a second capacitor C2. A gate of the fifth transistor M5 is coupled to the corresponding output control node PO_2, a first electrode of the fifth transistor M5 is configured to receive the signal of the corresponding second clock signal terminal CLK2_k, and a second electrode of the fifth transistor M5 is coupled to the corresponding second subscanning signal output terminal GOUT2_k. A gate of the sixth transistor M6 is coupled to the second node PD, a first electrode of the sixth transistor M6 is configured to receive the signal of the second reference signal terminal VREF2, and a second electrode of the sixth transistor M6 is coupled to the corresponding second subscanning signal output terminal GOUT2_k. The second capacitor C2 is coupled between the corresponding output control node PO_2 and the second subscanning signal output terminal GOUT2_k.

During specific implementation, in the embodiment of the present disclosure, the fifth transistor M5 in each second subscanning signal output circuit 42_k may be turned on under control of the signal of the output control node PO_2, so as to provide the signal of the corresponding second clock signal terminal CLK2_k to the corresponding second subscanning signal output terminal GOUT2_k. The sixth transistor M6 in each second subscanning signal output circuit 42_k may be turned on under control of the signal of the second node PD, so as to provide the signal of the second reference signal terminal VREF2 to the corresponding second subscanning signal output terminal GOUT2_k. The second capacitor C2 may maintain the level of the connected output control node PO_2 and the level of the second subscanning signal output terminal GOUT2_k, and may maintain the stability of a voltage difference between the output control node PO_2 and the second subscanning signal output terminal GOUT2_k when the output control node PO_2 is in floating.

During specific implementation, in the embodiment of the present disclosure, as shown in FIG. 4, the input circuit 11 may include a ninth transistor M9. A gate of the ninth transistor M9 is configured to receive the signal of the input signal terminal INPUT, a first electrode of the ninth transistor M9 is configured to receive the signal of the first reference signal terminal VREF1, and a second electrode of the ninth transistor M9 is coupled to the first node PU. The ninth transistor M9 may be turned on under control of the input signal terminal INPUT, to provide the signal of the first reference signal terminal VREF1 to the first node PU.

During specific implementation, in the embodiment of the present disclosure, as shown in FIG. 4, the reset circuit 12 may include a tenth transistor M10 and an eleventh transistor M11. A gate of the tenth transistor M10 is configured to receive the signal of the reset signal terminal RE, a first electrode of the tenth transistor M10 is configured to receive the signal of the third reference signal terminal VREF3, and a second electrode of the tenth transistor M10 is coupled to one output control node, i.e., the output control node PO_1. A gate of the eleventh transistor M11 is configured to receive the signal of the reset signal terminal RE, a first electrode of the eleventh transistor M11 is configured to receive the signal of the third reference signal terminal VREF3, and a second electrode of the eleventh transistor M11 is coupled to the other output control node, i.e., the output control node PO_2. The tenth transistor M10 may be turned on under control of an active pulse signal of the reset signal terminal RE, to provide the signal of the third reference signal terminal VREF3 to the output control node PO_1. The eleventh transistor M11 may be turned on under control of the reset signal terminal RE, to provide the signal of the third reference signal terminal VREF3 to the output control node PO_2.

During specific implementation, in the embodiment of the present disclosure, as shown in FIG. 4, the node control circuit 13 may include: a twelfth transistor M12, a thirteenth transistor M13, and an inverter ND, wherein a gate of the twelfth transistor M12 is coupled to the second node PD, a first electrode of the twelfth transistor M12 is configured to receive the signal of the third reference signal terminal VREF3, and a second electrode of the twelfth transistor M12 is coupled to one output control node, i.e., the output control node PO_1. A gate of the thirteenth transistor M13 is coupled to the second node PD, a first electrode of the thirteenth transistor M13 is configured to receive the signal of the third reference signal terminal VREF3, and a second electrode of the thirteenth transistor M13 is coupled to the other output control node, i.e., the output control node PO_2. An input terminal of the inverter ND is coupled to the first node PU, and an output terminal of the inverter ND is coupled to the second node PD. The twelfth transistor M12 may be turned on under control of the signal of the second node PD, to provide the signal of the third reference signal terminal VREF3 to the output control node PO_1. The thirteenth transistor M13 may be turned on under control of the signal of the second node PD, to provide the signal of the third reference signal terminal VREF3 to the output control node PO_2. The inverter may enable the levels of the input terminal and the output terminal to be opposite.

During specific implementation, in the embodiment of the present disclosure, as shown in FIG. 4, the cascade signal output circuit 30 may include a seventh transistor M7, an eighth transistor M8, and a third capacitor C3. A gate of the seventh transistor M7 is coupled to the first node PU, a first electrode of the seventh transistor M7 is configured to receive the signal of the third clock signal terminal CLK3, and a second electrode of the seventh transistor M7 is coupled to the cascade signal output terminal CROUT. A gate of the eighth transistor M8 is coupled to the second node PD, a first electrode of the eighth transistor M8 is configured to receive the signal of the third reference signal terminal VREF3, and a second electrode of the eighth transistor M8 is coupled to the cascade signal output terminal CROUT. The third capacitor C3 is coupled between the first node PU and the cascade signal output terminal CROUT. The seventh transistor M7 may be turned on under control of the signal of the first node PU, to provide the signal of the third clock signal terminal CLK3 to the cascade signal output terminal CROUT. The eighth transistor M8 may be turned on under control of the signal of the second node PD, to provide the signal of the third reference signal terminal VREF3 to the cascade signal output terminal CROUT. The third capacitor C3 may maintain the level of the first node PU and the level of the cascade signal output terminal CROUT, and may maintain the stability of a voltage difference between the first node PU and the cascade signal output terminal CROUT when the first node PU is in floating.

The foregoing is only for exemplifying the specific structures of the circuits in the shift register. During specific implementation, the specific structures of the above circuits are not limited to the above structures provided by the embodiment of the present disclosure, and may also be other structures known by those skilled in the art, and are not limited herein.

During specific implementation, in order to unify the manufacturing process, in the embodiment of the present disclosure, as shown in FIG. 4, the switching transistors may be N-type transistors. It should be noted that the embodiment of the present disclosure is only illustrated by taking the transistors in the shift register being the N-type transistors as an example. For such a case that the transistors are P-type transistors, the design principle is the same as that of the present disclosure, and also falls within the scope of the protection of the present disclosure.

It should be noted that in the embodiment of the present disclosure, when the transistors are the N-type transistors, the signal of the first reference signal terminal is a high-level signal, and the signal of the second reference signal terminal and the signal of the third reference signal terminal are both low-level signals. When the transistors are the P-type transistors, the signal of the first reference signal terminal is a low-level signal, and the signal of the second reference signal terminal and the signal of the third reference signal terminal are both high-level signals. It should be noted that the levels of the signals, which are described in the embodiment of the present disclosure only denote logic levels instead of voltage values actually applied to the signals during specific implementation.

Figure 5:
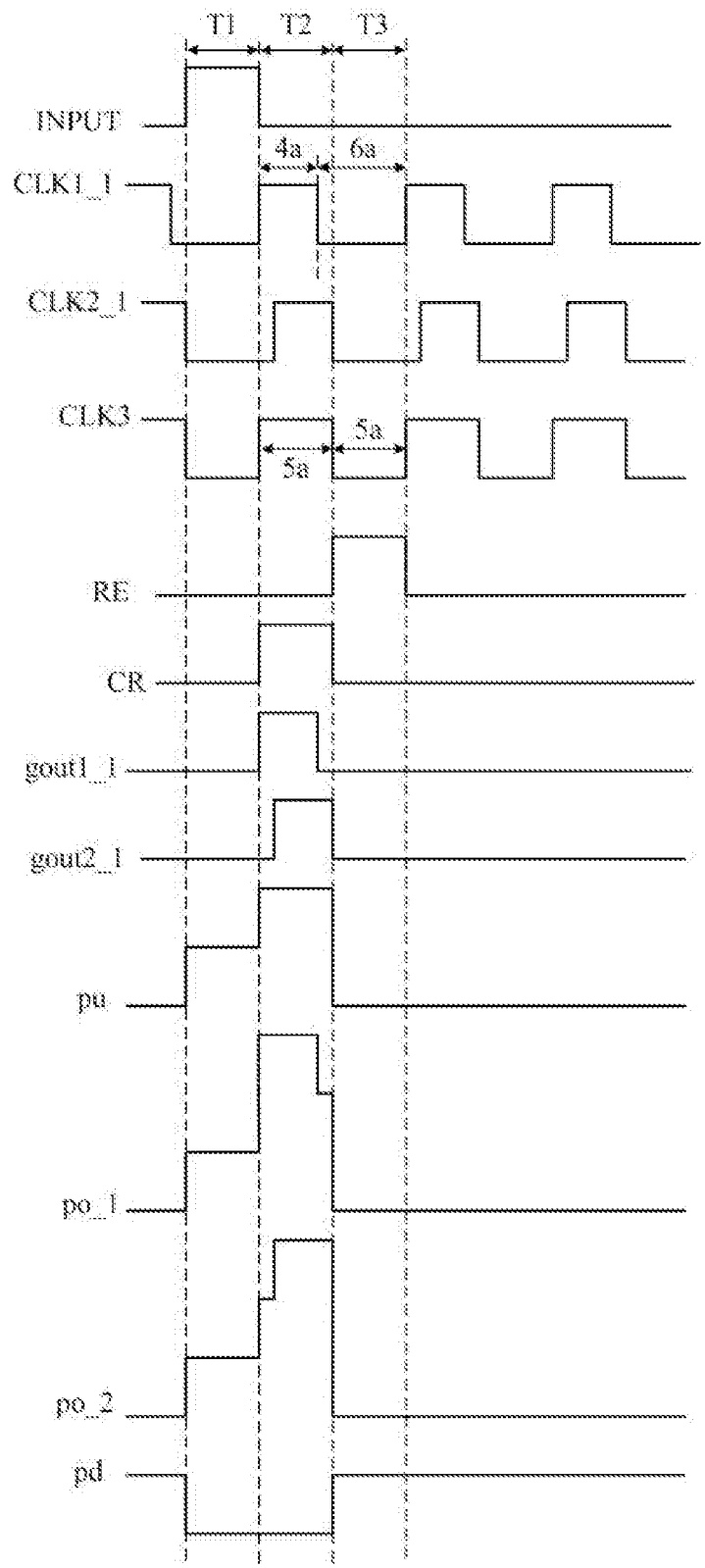
FIG. 5 is a circuit timing diagram in accordance with an embodiment of the present disclosure.

Generally, one frame period during display driving may include a display scanning period and a blanking time period. During specific implementation, in the display scanning period, timing of the signals of the first clock signal terminals are the same, timing of the signals of the second clock signal terminals are the same, and the timing of the signals of the first clock signal terminals and the second clock signal terminals are different. For example, as shown in FIG. 5, the timing of the first clock signal terminal CLK1_1 and timing of the second clock signal terminal CLK2_1 are different. It should be noted that voltage values of the high-level signals described in the embodiment of the present disclosure are the same, for example, the high-level voltage value of the input signal terminal INPUT, the high-level voltage value of the first clock signal terminal CLK1_1, the high-level voltage value of the second clock signal terminal CLK2_1, and the voltage value of the first reference signal terminal VREF1 are the same. Further, voltage values of the low-level signals described in the embodiment of the present disclosure may also be the same, for example, the low-level voltage value of the input signal terminal INPUT, the low-level voltage value of the first clock signal terminal CLK1_1, the low-level voltage value of the second clock signal terminal CLK2_1, and the voltage values of the second reference signal terminal VREF2 and the third reference signal terminal VREF3 are the same. In order to reduce the number of signal terminals and reduce spaces occupied by signal lines, the second reference signal terminal VREF2 and the third reference signal terminal VREF3 may be set to have a same signal, that is, the same reference signal terminal is used to provide the signals of the second reference signal terminal VREF2 and the third reference signal terminal VREF3. Or, the voltage values of the second reference signal terminal VREF2 and the third reference signal terminal VREF3 may also be different, and are not limited herein.

During specific implementation, as shown in FIG. 5, the cycles of the first clock signal terminal CLK1_n, the second clock signal terminal CLK2_n and the third clock signal terminal CLK3 are the same. For example, in one cycle, the duration of the high-level signal of the first clock signal terminal CLK1_n may be 4a, and the duration of the low-level signal of the first clock signal terminal CLK1_n may be 6a, so that the duration of one cycle of the signal of the first clock signal terminal CLK1_n is 10a. In one cycle, the duration of the high-level signal of the second clock signal terminal CLK2_n may be 4a, and the duration of the low-level signal of the second clock signal terminal CLK2_n may be 6a, so that the duration of one cycle of the signal of the second clock signal terminal CLK2_n is 10a. In one cycle, the duration of the high-level signal of the third clock signal terminal CLK3 may be 5a, and the duration of the low-level signal of the third clock signal terminal CLK3 may be 5a, so that the duration of one cycle of the signal of the third clock signal terminal CLK3 is also 10a. Further, in the same cycle, a rising edge of the third clock signal terminal CLK3 appears before a rising edge of the first clock signal terminal CLK1_n, and a falling edge of the third clock signal terminal CLK3 appears after a falling edge of the second clock signal terminal CLK2_n. For example, as shown in FIG. 5, in the same cycle, the rising edge of the third clock signal terminal CLK3 is aligned with a rising edge of the first clock signal terminal CLK1_1, and the falling edge of the third clock signal terminal CLK3 is aligned with a falling edge of the second clock signal terminal CLK2_1.

During specific implementation, in the shift register according to the embodiment of the present disclosure, the N-type transistors are turned on under a high-level signal and turned off under a low-level signal. The P-type transistors are turned on under the low-level signal and turned off under the high-level signal. During specific implementation, the first electrode of each transistor may be used as a source electrode, and the second electrode of each transistor may be used as a drain electrode, or the first electrode of each transistor may be used as the drain electrode, and the second electrode of each transistor may be used as the source electrode. No specific distinction is made here.

The structure of the shift register shown in FIG. 4 is exemplified below to describe the working process of the above shift register according to the embodiment of the present disclosure in combination with the circuit timing diagram, i.e., FIG. 5. In the following description, 1 denotes a high-level signal, and 0 denotes a low-level signal. 1 and 0 represent logic levels, which are merely to better explain the working process of the above shift register according to the embodiment of the present disclosure, instead of indicating the voltage value applied to the gate of each transistor during specific implementation.

Specifically, an input period T1, an output period T2 and a reset period T3 in the circuit timing diagram as shown in FIG. 5 are selected.

In the input period T1, INPUT is equal to 1, CLK1_1 is equal to 0, CLK2_1 is equal to 0, CLK3 is equal to 0, and RE is equal to 0.

Since INPUT is equal to 1, the ninth transistor M9 is turned on, to provide a high level of the first reference signal terminal VREF1 to the first node PU, to enable the signal of the first node PU to be a high-level signal. Since the signal of the first node PU is the high-level signal, the seventh transistor M7 is turned on, and enables the signal of the second node PD to be a low-level signal under the inverter ND. Therefore, the fourth transistor M4, the sixth transistor M6, the eighth transistor M8, the twelfth transistor M12, and the thirteenth transistor M13 are all controlled to be turned off. The turned-on seventh transistor M7 provides a low level of the third clock signal terminal CLK3 to the cascade signal output terminal CROUT, so as to output a low-level cascade signal CR. Since the first transistor M1 and the second transistor M2 form a diode connection structure, the signals of the output control nodes PO_1 and PO_2 are also high-level signals. Since the signal of the output control node PO_1 is the high-level signal, the third transistor M3 is turned on to provide a low level of the first clock signal terminal CLK1_1 to the first subscanning signal output terminal GOUT1_1 to output a low-level scanning signal gout1_1, and the first capacitor C1 is charged. Since the signal of the output control node PO_2 is the high-level signal, the fifth transistor M5 is turned on to provide a low level of the second clock signal terminal CLK2_1 to the second subscanning signal output terminal GOUT2_1 to output a low-level scanning signal gout2_1, and the second capacitor C2 is charged. Furthermore, RE is equal to 0, so that the tenth transistor M10 and the eleventh transistor M11 are both turned off.

In the output period T2, INPUT is equal to 0, CLK1_1 is equal to 1, CLK2_1 is equal to 0, CLK3 is equal to 1, and RE is equal to 0.

INPUT is equal to 1, so that the ninth transistor M9 is turned off, and the first node PU is in floating. Under the action of the third capacitor C3, the signal of the first node PU may be maintained to be the high-level signal, and the seventh transistor M7 may be turned on, and under the inverter ND, the signal of the second node PD is the low-level signal, so that the fourth transistor M4, the sixth transistor M6, the eighth transistor M8, the twelfth transistor M12, and the thirteenth transistor M13 are controlled to be turned off. The turned-on seventh transistor M7 provides a high level of the third clock signal terminal CLK3 to the cascade signal output terminal CROUT. Due to the floating of the first node PU and under the third capacitor C3, the level of the first node PU may be pulled up to enable the seventh transistor M7 to provide the high level of the third clock signal terminal CLK3 to the cascade signal output terminal CROUT and output a high-level cascade signal CR. Furthermore, the level of the first node PU is pulled up, so that the levels of the output control nodes PO_1 and PO_2 are also pulled up. Since the level of the output control node PO_1 is pulled up, the third transistor M3 is turned on to provide the low level of the first clock signal terminal CLK1_1 to the first subscanning signal output terminal GOUT1_1 to output a low-level scanning signal gout1_1. Under the first capacitor C1, the level of the output control node PO_1 is further pulled up, so that the third transistor M3 provides the high level of the first clock signal terminal CLK1_1 to the first subscanning signal output terminal GOUT1_1 to output a high-level scanning signal gout1_1. When the first node PU is pulled up, and the level of the output control node PO_1 is further pulled up, the first transistor M1 forms a diode connection, so that the first node PU and the output control node PO_1 are turned off to avoid that the signal of the output control node PO_2 is affected when the output control node PO_1 is further pulled up. Since the level of the output control node PO_2 is pulled up, the fifth transistor M5 is turned on to provide the low level of the second clock signal terminal CLK2_1 to the second subscanning signal output terminal GOUT2_1 to output a low-level scanning signal gout2_1. Furthermore, RE is equal to 0, so that the tenth transistor M10 and the eleventh transistor M11 are both turned off.

Then, the second clock signal terminal CLK2_1 is converted from the low-level signal to the high-level signal, i.e., from CLK2_1=0 to CLK2_1=1, and other signals do not change. At the moment, since the fifth transistor M5 provides the high level of the second clock signal terminal CLK2_1 to the second subscanning signal output terminal GOUT2_1, under the action of the second capacitor C2, the level of the output control node PO_2 may be further pulled up to enable the fifth transistor M5 to provide the high level of the second clock signal terminal CLK2_1 to the second subscanning signal output terminal GOUT2_1 to output a high-level scanning signal gout2_1. When the first node PU is pulled up, and the level of the output control node PO_2 is further pulled up, the second transistor M2 forms a diode connection, so that the first node PU and the output control node PO_2 are turned off to avoid that the signal of the output control node PO_1 is affected when the output control node PO_2 is further pulled up.

Then, the first clock signal terminal CLK1_1 is converted from the high-level signal to the low-level signal, i.e., from CLK1_1=1 to CLK1_1=0, and other signals do not change. In this way, the third transistor M3 provides the low level of the first clock signal terminal CLK1_1 to the first subscanning signal output terminal GOUT1_1 to output a low-level scanning signal gout1_1.

In the reset period T3, INPUT is equal to 0, and RE is equal to 1.

INPUT is equal to 0, so that the ninth transistor M9 is turned off RE is equal to 1, so that the tenth transistor M10 and the eleventh transistor M11 are both turned on. The turned-on tenth transistor M10 provides the low level of the third reference signal terminal VREF3 to the output control node PO_1 to enable the signal of the output control node PO_1 to be the low-level signal, and the turned-on eleventh transistor M11 provides the low level of the third reference signal terminal VREF3 to the output control node PO_2 to enable the signal of the output control node PO_2 to be the low-level signal, so that the first node PU may be discharged to have the low-level signal. In this way, under the action of the inverter ND, the second node PD may have the high-level signal. The signal of the second node PD is the high-level signal, so that the fourth transistor M4, the sixth transistor M6, the eighth transistor M8, the twelfth transistor M12, and the thirteenth transistor M13 are controlled to be turned on. The turned-on fourth transistor M4 provides the low level of the second reference signal terminal VREF2 to the first subscanning signal output terminal GOUT1_1, so as to output a low-level scanning signal gout1_1. The turned-on sixth transistor M6 provides the low level of the second reference signal terminal VREF2 to the second subscanning signal output terminal GOUT2_1, so as to output a low-level scanning signal gout2_1. The turned-on eighth transistor M8 provides the low level of the third reference signal terminal VREF3 to the cascade signal output terminal CROUT, so as to output a low-level cascade signal CR. The turned-on twelfth transistor M12 provides the low level of the third reference signal terminal VREF3 to the output control node PO_1, so that the signal of the output control node PO_1 is further to be at a low level. The turned-on thirteenth transistor M13 provides the low level of the third reference signal terminal VREF3 to the output control node PO_2, so that the signal of the output control node PO_2 is further made to be at a low level.

After the reset period T3, INPUT is equal to 0, and RE is equal to 0, so that the signal of the output control node PO_1 is maintained to be the low-level signal through the first capacitor C1, the signal of the output control node PO_2 is maintained to be the low-level signal through the second capacitor C2, and the signal of the first node PU is maintained to be the low-level signal through the third capacitor C3, so that the signal of the second node PD is the high-level signal, and the fourth transistor M4, the sixth transistor M6, the eighth transistor M8, the twelfth transistor M12, and the thirteenth transistor M13 are controlled to be turned on. The turned-on fourth transistor M4 provides the low level of the second reference signal terminal VREF2 to the first subscanning signal output terminal GOUT1_1, so as to output a low-level scanning signal gout1_1. The turned-on sixth transistor M6 provides the low level of the second reference signal terminal VREF2 to the second subscanning signal output terminal GOUT2_1, so as to output a low-level scanning signal gout2_1. The turned-on eighth transistor M8 provides the low level of the third reference signal terminal VREF3 to the cascade signal output terminal CROUT, so as to output a low-level cascade signal CR. The turned-on twelfth transistor M12 provides the low level of the third reference signal terminal VREF3 to the output control node PO_1, so that the signal of the output control node PO_1 is further to be at a low level. The turned-on thirteenth transistor M13 provides the low level of the third reference signal terminal VREF3 to the output control node PO_2, so that the signal of the output control node PO_2 is further to be at a low level.

Figure 6:
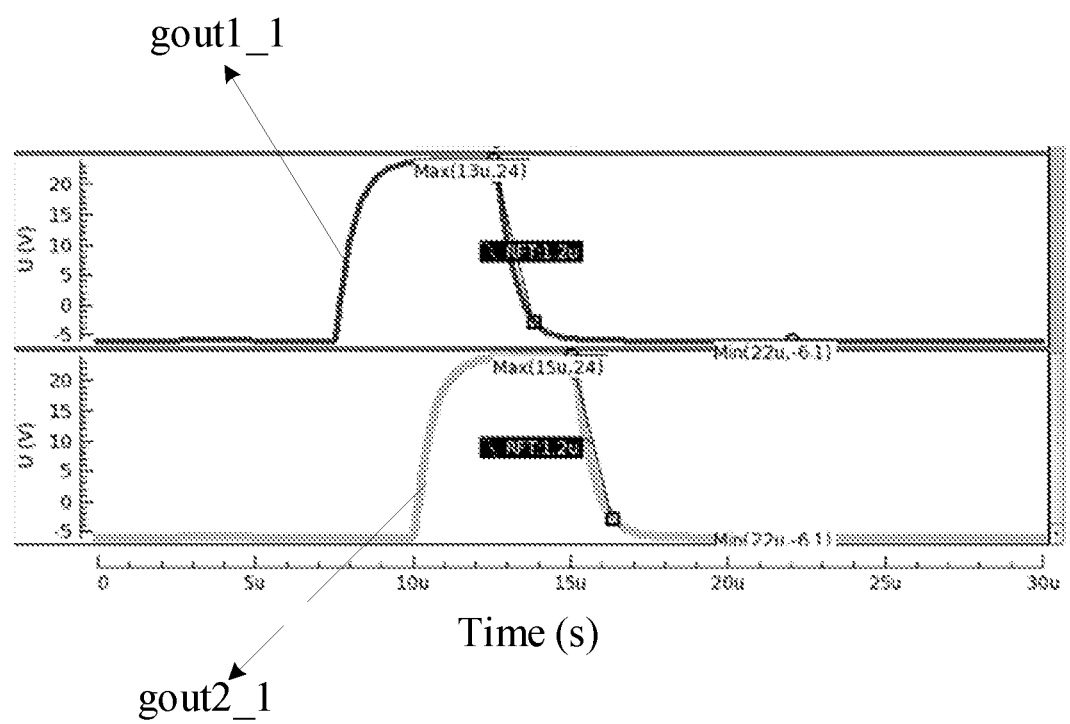
FIG. 6 is a simulation timing diagram of the shift register shown in FIG. 4 after simulation is performed on the shift register.

Furthermore, the shift register according to the present disclosure may enable the signals of different output control nodes to not affect each other, so that the stability of the waveforms of the output scanning signals may be improved, and a difference in the waveforms of the scanning signals is avoided. A simulation diagram as shown in FIG. 6 is obtained through simulation of the shift register in Embodiment I. It can be seen from FIG. 6 that durations of converting the scanning signal gout1_1 and the scanning signal gout2_1 from the high-level signals to the low-level signals are both 12 us, so that the waveforms of the scanning signal gout1_1 and the scanning signal gout2_1 may be higher in similarity and have relatively smaller difference.

In actual application, the shift register in Embodiment I is applied to an array substrate of a display device. The array substrate includes a plurality of gate lines, so that the shift register in Embodiment I outputs scanning signals having a phase difference to two gate lines. The display device may be an organic light-emitting diode (OLED) display device, or may be a liquid crystal display (LCD), which is not limited herein.

Furthermore, in the output period, since the first node PU is pulled up by the third capacitor, the levels of the output control nodes PO_1 and PO_2 may be further pulled up under a pulling up condition, and the driving capacity of the third transistor M3 and the driving capacity of the fifth transistor M5 are improved.

Embodiment II

The same parts of a shift register provided by Embodiment II of the present disclosure as those of the shift register provided by Embodiment I are not repeated herein, and only the different parts will be described below.

Figure 7:
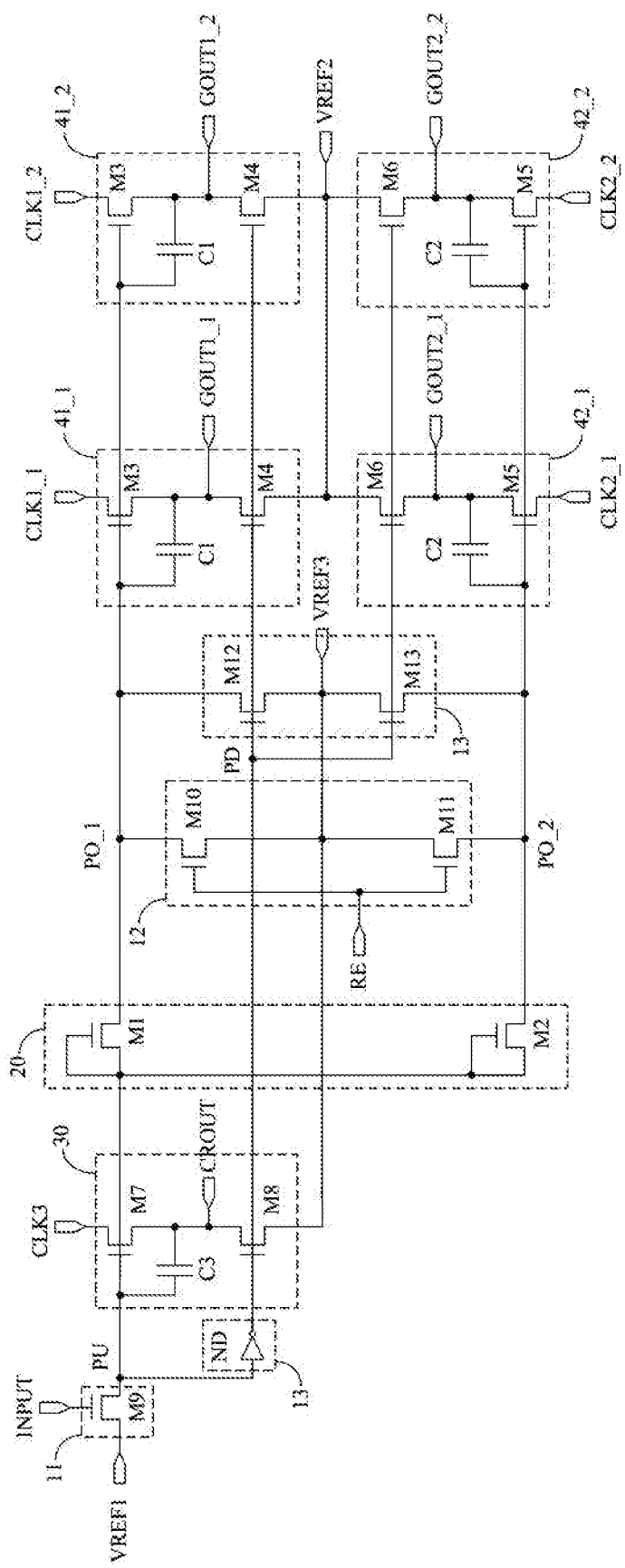
FIG. 7 is another specific schematic structural diagram of a shift register in accordance with an embodiment of the present disclosure.

During specific implementation, in the embodiment of the present disclosure, as shown in FIG. 7, the shift register is provided with two first subscanning signal output circuits 41_1 and 41_2, and two second subscanning signal output circuits 42_1 and 42_2. The first subscanning signal output circuit 41_1 corresponds to a first clock signal terminal CLK1_1 and a first subscanning signal output terminal GOUT1_1. The first subscanning signal output circuit 41_2 corresponds to a first clock signal terminal CLK1_2 and a first subscanning signal output terminal GOUT1_2. The second subscanning signal output circuit 42_1 corresponds to a second clock signal terminal CLK2_1 and a second subscanning signal output terminal GOUT2_1. The second subscanning signal output circuit 42_2 corresponds to a second clock signal terminal CLK2_2 and a second subscanning signal output terminal GOUT2_2.

Figure 8:
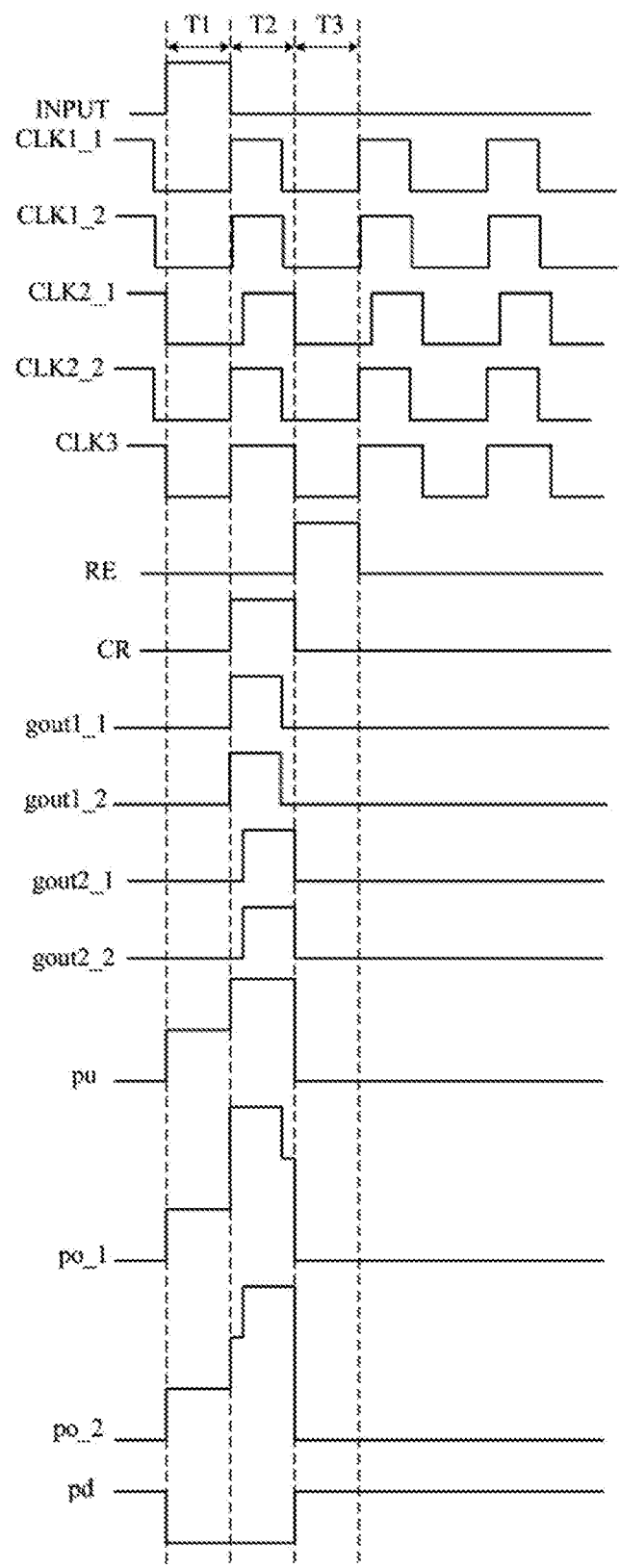
FIG. 8 is another circuit timing diagram in accordance with an embodiment of the present disclosure.

The working process of the above shift register provided by the present embodiment is described below in combination with a circuit timing diagram shown in FIG. 8. Specifically, an input period T1, an output period T2 and a reset period T3 in the circuit timing diagram as shown in FIG. 8 are selected.

In the input period T1, INPUT is equal to 1, CLK1_1 is equal to 0, CLK1_2 is equal to 0, CLK2_1 is equal to 0, CLK2_2 is equal to 0, CLK3 is equal to 0, and RE is equal to 0. Only a third transistor M3, a fourth transistor M4, and a first capacitor C1 in the first subscanning signal output circuit 41_2, and a fifth transistor M5, a sixth transistor M6, and a second capacitor C2 in the second subscanning signal output circuit 42_2 are described below. The rest working process in the input period may be basically the same as the working process of the input period T1 in Embodiment I, and no more details are described herein. Specifically, since a signal of an output control node PO_1 is a high-level signal, the third transistor M3 is turned on to provide a low level of the first clock signal terminal CLK1_2 to the first subscanning signal output terminal GOUT1_2 to output a low-level scanning signal gout1_2, and the first capacitor C1 is charged. Since a signal of the output control node PO_2 is a high-level signal, the fifth transistor M5 is turned on to provide a low level of the second clock signal terminal CLK2_2 to the second subscanning signal output terminal GOUT2_2 to output a low-level scanning signal gout2_2, and the second capacitor C2 is charged.

In the output period T2, INPUT is equal to 0, CLK1_1 is equal to 1, CLK1_2 is equal to 1, CLK2_1 is equal to 0, CLK2_2 is equal to 0, CLK3 is equal to 1, and RE is equal to 0. Only the third transistor M3, the fourth transistor M4, and the first capacitor C1 in the first subscanning signal output circuit 41_2, and the fifth transistor M5, the sixth transistor M6, and the second capacitor C2 in the second subscanning signal output circuit 42_2 are described below. The rest working process of the output period may be basically the same as the working process of the output period T2 in Embodiment I, and no more details are described herein. Since a level of the output control node PO_1 is further pulled up, the third transistor M3 provides a high level of the first clock signal terminal CLK1_2 to the first subscanning signal output terminal GOUT1_2 to output a high-level scanning signal gout1_2. Then, the second clock signal terminal CLK2_2 is converted from the low-level signal to the high-level signal. Since a level of the output control node PO_2 is further pulled up, the fifth transistor M5 provides a high level of the second clock signal terminal CLK2_2 to the second subscanning signal output terminal GOUT2_2 to output a high-level scanning signal gout2_2. Then, the first clock signal terminal CLK1_2 is converted from the high-level signal to the low-level signal, i.e., from CLK1_2=1 to CLK1_2=0, and other signals do not change. In this way, the third transistor M3 provides the low level of the first clock signal terminal CLK1_2 to the first subscanning signal output terminal GOUT1_2 to output a low-level scanning signal gout1_2.

In the reset period T3, INPUT is equal to 0, and RE is equal to 1. Only the third transistor M3, the fourth transistor M4, and the first capacitor C1 in the first subscanning signal output circuit 41_2, and the fifth transistor M5, the sixth transistor M6, and the second capacitor C2 in the second subscanning signal output circuit 42_2 are described below. The rest working process of the reset period may be basically the same as the working process of the reset period T3 in Embodiment I, and no more details are described herein. The third transistor M3 and the fifth transistor M5 are both turned off, and the fourth transistor M4 and the sixth transistor M6 are both turned on. The turned-on fourth transistor M4 provides a low level of a second reference signal terminal VREF2 to the first subscanning signal output terminal GOUT1_2, so as to output a low-level scanning signal gout1_2. The turned-on sixth transistor M6 provides the low level of the second reference signal terminal VREF2 to the second subscanning signal output terminal GOUT2_2, so as to output a low-level scanning signal gout2_2.

After the reset period T3, INPUT is equal to 0, and RE is equal to 0. Only the third transistor M3, the fourth transistor M4, and the first capacitor C1 in the first subscanning signal output circuit 41_2, and the fifth transistor M5, the sixth transistor M6, and the second capacitor C2 in the second subscanning signal output circuit 42_2 are described below. The third transistor M3 and the fifth transistor M5 are both turned off, and the fourth transistor M4 and the sixth transistor M6 are both turned on. The turned-on fourth transistor M4 provides the low level of the second reference signal terminal VREF2 to the first subscanning signal output terminal GOUT1_2, so as to output a low-level scanning signal gout1_2. The turned-on sixth transistor M6 provides the low level of the second reference signal terminal VREF2 to the second subscanning signal output terminal GOUT2_2, so as to output a low-level scanning signal gout2_2.

In this way, the first subscanning signal output circuit 41_1 and the first subscanning signal output circuit 41_2 may output scanning signals having same timing and waveforms, and may input the two scanning signals into a same gate line in one row to improve the driving capacity. In the similar way, the second subscanning signal output circuit 42_1 and the second subscanning signal output circuit 42_2 may output scanning signals having same timing and waveforms, and may input the two scanning signals into a same gate line in a next row to improve the driving capacity.

Embodiment III

The same parts of a shift register provided by Embodiment III of the present disclosure as those of the shift register provided by Embodiment II are not repeated herein, and only the different parts will be described below.

Figure 9:
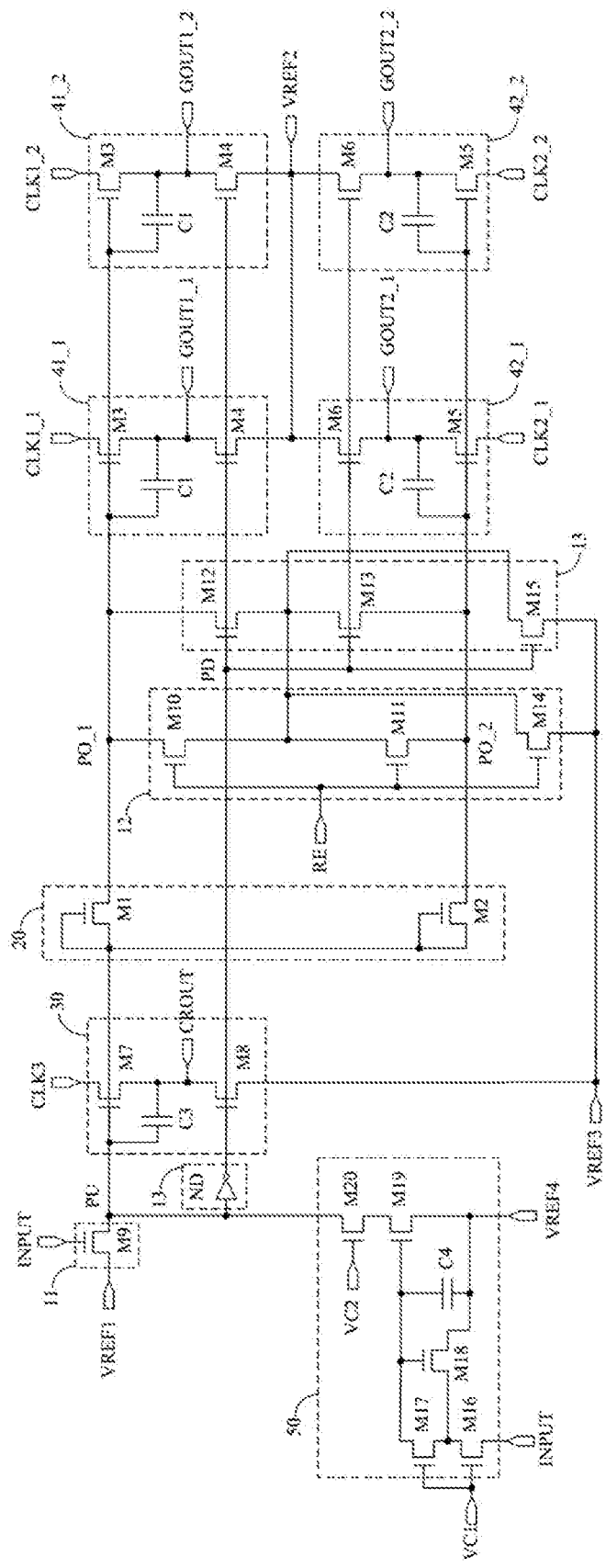
FIG. 9 is another specific schematic structural diagram of a shift register in accordance with an embodiment of the present disclosure.

During specific implementation, two scanning signal output circuits are provided. In the embodiment of the present disclosure, as shown in FIG. 9, the reset circuit 12 may further include: a fourteenth transistor M14, wherein the first electrode of the tenth transistor M10 and the first electrode of the eleventh transistor M11 respectively receive the signal of the third reference signal terminal VREF3 through the fourteenth transistor M14. A gate of the fourteenth transistor M14 is configured to receive a reset signal RE, a first electrode of the fourteenth transistor M14 is configured to receive the signal of the third reference signal terminal VREF3, a second electrode of the fourteenth transistor M14 is coupled to the first electrode of the tenth transistor M10 and the first electrode of the eleventh transistor M11, respectively. The fourteenth transistor M14 is turned on under control of a high-level signal of a reset signal terminal RE, to provide the signal of the third reference signal terminal VREF3 to the first electrode of the tenth transistor M10 and the first electrode of the eleventh transistor M11, respectively. In this way, the influence on the tenth transistor M10 and the eleventh transistor M11 caused by varying of the signal of the third reference signal terminal VREF3 may be avoided, and the circuit stability is improved.

During specific implementation, in the embodiment of the present disclosure, as shown in FIG. 9, the node control circuit 13 further includes: a fifteenth transistor M15, wherein the first electrode of the twelfth transistor M12 and the first electrode of the thirteenth transistor M13 respectively receive the signal of the third reference signal terminal VREF3 through the fifteenth transistor M15. A gate of the fifteenth transistor M15 is coupled to the second node PD, a first electrode of the fifteenth transistor M15 is configured to receive the signal of the third reference signal terminal VREF3, and a second electrode of the fifteenth transistor M15 is coupled to the first electrode of the twelfth transistor M12 and the first electrode of the thirteenth transistor M13, respectively. The fifteenth transistor M15 is turned on under control of a high-level signal of the second node PD, to provide the signal of the third reference signal terminal VREF3 to the first electrode of the twelfth transistor M12 and the first electrode of the thirteenth transistor M13, respectively. In this way, the influence on the twelfth transistor M12 and the thirteenth transistor M13 caused by varying of the signal of the third reference signal terminal VREF3 may be avoided, and the circuit stability is improved.

Figure 10:
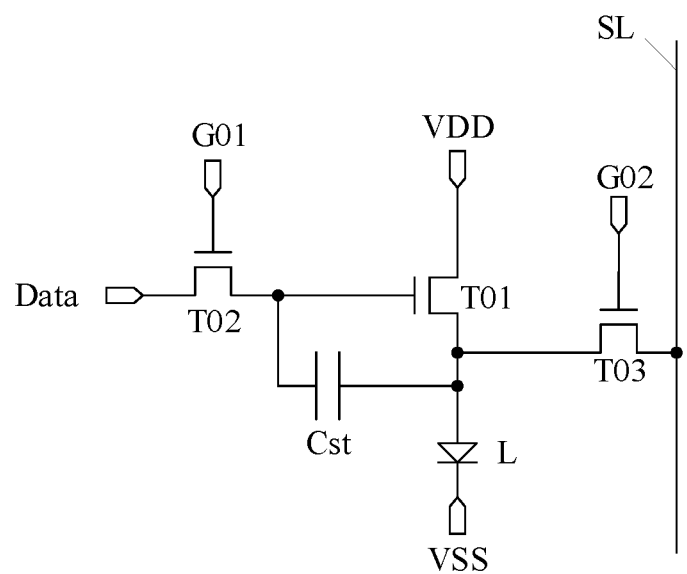
FIG. 10 is a schematic structural diagram of a pixel circuit in accordance with an embodiment of the present disclosure.

Generally, in an organic light-emitting diode (OLED) display device, a pixel circuit in a 3T1C form shown in FIG. 10 is adopted to drive an OLED to emit light, and to perform external threshold compensation on the OLED. The pixel circuit includes: a driving transistor T01, transistors T02-T03, and a storage capacitor Cst. The pixel circuit controls the transistor T02 to be turned on to write data voltage of a data signal terminal Data into a gate of the driving transistor T01, and controls the driving transistor T01 to generate working current to drive an OLED L to emit light. A signal carrying threshold voltage information of the driving transistor T01 is output by the transistor T03 through a detection line SL. In this way, one row of pixel circuits need to correspond to two gate lines, so as to respectively input signals G01 and G02. In order to control the above pixel circuit, during specific implementation, in the embodiment of the present disclosure, as shown in FIG. 9, the shift register may further include: a detection circuit 50. The detection circuit 50 may include: a sixteenth transistor M16, a seventeenth transistor M17, an eighteenth transistor M18, a nineteenth transistor M19, a twentieth transistor M20, and a fourth capacitor C4. A gate of the sixteenth transistor M16 is configured to receive a signal of a first detection control signal terminal VC1, a first electrode of the sixteenth transistor M16 is configured to receive the signal of the input signal terminal INPUT, and a second electrode of the sixteenth transistor M16 is coupled to a first electrode of the eighteenth transistor M18. A gate of the seventeenth transistor M17 is configured to receive the signal of the first detection control signal terminal VC1, a first electrode of the seventeenth transistor M17 is coupled to a gate of the nineteenth transistor M19, and a second electrode of the seventeenth transistor M17 is coupled to the first electrode of the eighteenth transistor M18. A gate of the eighteenth transistor M18 is coupled to the gate of the nineteenth transistor M19, and a second electrode of the eighteenth transistor M18 is configured to receive a signal of a fourth reference signal terminal VREF4. A first electrode of the nineteenth transistor M19 is configured to receive the signal of the fourth reference signal terminal VREF4, and a second electrode of the nineteenth transistor M19 is coupled to a first electrode of the twentieth transistor M20. A gate of the twentieth transistor M20 is configured to receive a signal of a second detection control signal VC2, and a second electrode of the twentieth transistor M20 is coupled to the first node PU. The fourth capacitor C4 is coupled between the first electrode of the nineteenth transistor M19 and the gate of the nineteenth transistor M19. Specifically, the sixteenth transistor M16 may be turned on under control of the first detection control signal terminal VC1, so as to provide the signal of the input signal terminal INPUT to the first electrode of the eighteenth transistor M18 and the second electrode of the seventeenth transistor M17. The seventeenth transistor M17 may be turned on under control of the first detection control signal terminal VC1, so as to provide a signal of the second electrode of the seventeenth transistor M17 to the gate of the nineteenth transistor M19 and the gate of the eighteenth transistor M18. The eighteenth transistor M18 may be turned on under control of a signal of the gate of the eighteenth transistor M18. The nineteenth transistor M19 may be turned on under control of a signal of the gate of the nineteenth transistor M19, so as to provide the signal of the fourth reference signal terminal VREF4 to the first electrode of the twentieth transistor M20. The twentieth transistor M20 may be turned on under control of the second detection control signal terminal VC2, so as to provide a signal of the first electrode of the twentieth transistor M20 to the first node PU.

During specific implementation, a high-level signal may be loaded to the fourth reference signal terminal. Further, the voltage value of the fourth reference signal terminal may be equal to the voltage value of the first reference signal terminal. In order to reduce the number of signal terminals and reduce spaces occupied by signal lines, the fourth reference signal terminal and the first reference signal terminal may be set to have a same signal, that is, a same reference signal terminal is used to provide the signals of the fourth reference signal terminal and the first reference signal terminal.

Figure 11:
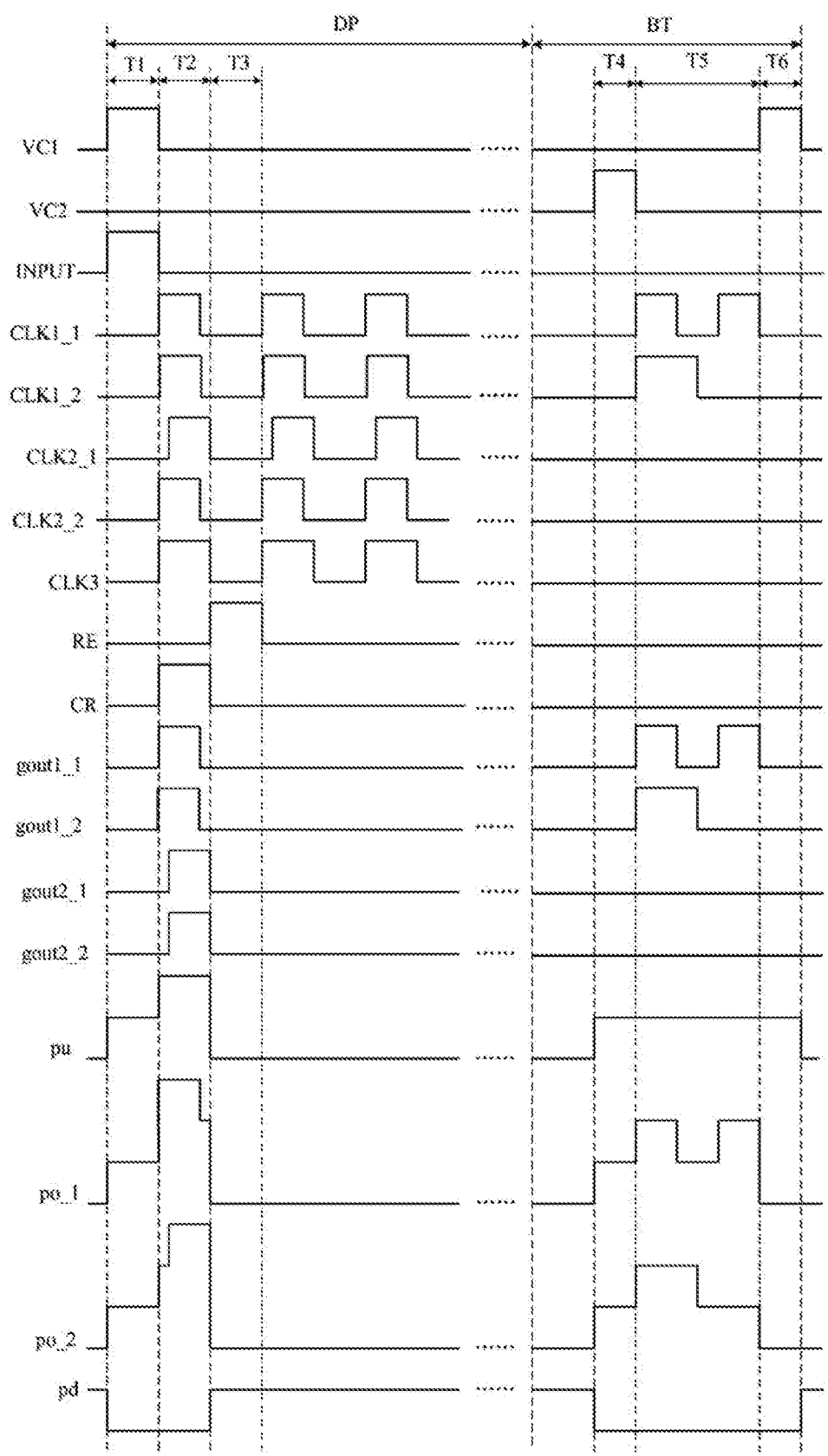
FIG. 11 is another circuit timing diagram in accordance with an embodiment of the present disclosure.

The working process of the above shift register provided by the present embodiment is described below in combination with a circuit timing diagram shown in FIG. 11. Specifically, one frame period is divided into a display scanning period DP and a blanking time period BT. Signal timings of the first clock signal terminals CLK1_n in the display scanning period DP are the same, and signal timings of the first clock signal terminals CLK1_*n* in the blanking time period BT are different. In the similar way, signal timings of the second clock signal terminals CLK2_*n* in the display scanning period DP are the same, and signal timings of the second clock signal terminals CLK2_*n* in the blanking time period BT are different.

Specifically, the display scanning period DP includes: an input period T1, an output period T2, and a reset period T3. In the input period T1, INPUT is equal to 1, CLK1_1 is equal to 0, CLK1_2 is equal to 0, CLK2_1 is equal to 0, CLK2_2 is equal to 0, CLK3 is equal to 0, RE is equal to 0, VC1 is equal to 1, and VC2 is equal to 0. Since RE is equal to 0, so that the fourteenth transistor M14 is turned off. Since the signal of the second node PD is a low-level signal, the fifteenth transistor M15 is turned off. Since VC1 is equal to 1, the sixteenth transistor M16 and the seventeenth transistor M17 are both turned on, to provide the high-level signal of the input signal terminal INPUT to the gate of the nineteenth transistor M19, and the fourth capacitor C4 maintains the high-level signal, and controls the nineteenth transistor M19 to be turned on, so as to provide the high level of the fourth reference signal terminal VREF4 to the twentieth transistor M20. However, since VC2 is equal to 0, the twentieth transistor M20 is turned off, thereby not affecting the signal of the first node PU. The rest working process of the input period may be basically the same as the working process of the input period T1 in Embodiment II, and no more details are described herein. Furthermore, the working processes of the output period T2 and the reset period T3 in Embodiment III may be basically the same as the working processes of the output period T2 and the reset period T3 in Embodiment II, and no more details are described herein.

The blanking time period BT may include: a detection input period T4, a detection output period T5, and a detection reset period T6. At the blanking time period BT, low-level signals are applied to the input signal terminal INPUT, the reset signal RE, the second clock signal terminals CLK2_1-CLK2_2, the third clock signal terminal CLK3, and the first to fourth reference signal terminals VREF4.

In the detection input period T4, VC1 is equal to 0, VC2 is equal to 1, CLK1_1 is equal to 0, and CLK1_2 is equal to 0. Since VC1 is equal to 0, the sixteenth transistor M16 and the seventeenth transistor M17 are both turned off. Under the action of the fourth capacitor C4, the gate of the nineteenth transistor M19 is a high-level signal, so as to control the nineteenth transistor M19 to be turned on. Since VC2 is equal to 1, the twentieth transistor M20 is turned on, so as to provide the high level of the fourth reference signal terminal VREF4 to the first node PU. Since the signal of the first node PU is the high-level signal, the seventh transistor M7 is turned on, and enables the signal of the second node PD to be a low-level signal under the action of the inverter ND. Therefore, the fourth transistor M4, the sixth transistor M6, the eighth transistor M8, the twelfth transistor M12, and the thirteenth transistor M13 are controlled to be turned off. The turned-on seventh transistor M7 provides the low level of the third clock signal terminal CLK3 to the cascade signal output terminal CROUT, so as to output a low-level cascade signal CR. Since the first transistor M1 and the second transistor M2 form a diode connection structure, the signals of the output control nodes PO_1 and PO_2 are also high-level signals. The signal of the output control node PO_1 is the high-level signal, so that the two third transistors M3 are both turned on. The third transistor M3 in the first subscanning signal output circuit 41_1 provides the signal of the first clock signal terminal CLK1_1 to the first subscanning signal output terminal GOUT1_1 to output a low-level scanning signal gout1_1. The third transistor M3 in the first subscanning signal output circuit 41_2 provides the signal of the first clock signal terminal CLK1_2 to the first subscanning signal output terminal GOUT1_2 to output a low-level scanning signal gout1_2. The signal of the output control node PO_2 is the high-level signal, so that the two fifth transistors M5 are both turned on. The fifth transistor M5 in the second subscanning signal output circuit 42_1 provides the signal of the second clock signal terminal CLK2_1 to the second subscanning signal output terminal GOUT2_1 to output a low-level scanning signal gout2_1. The fifth transistor M5 in the second subscanning signal output circuit 42_2 provides the signal of the second clock signal terminal CLK2_2 to the second subscanning signal output terminal GOUT2_2 to output a low-level scanning signal gout2_2.

In the detection output period T5, VC1 is equal to 0, VC2 is equal to 0, the first clock signal terminal CLK_1 has two high-level pulses, and the first clock signal terminal CLK1_2 has one high-level pulse. Specifically, under the action of the first capacitor C1, the signal of the output control node PO_1 is the high-level signal, so that the two third transistors M3 are both turned on. The third transistor M3 in the first subscanning signal output circuit 41_1 provides the signal of the first clock signal terminal CLK1_1 to the first subscanning signal output terminal GOUT1_1 to output a scanning signal gout1_1 having two high-level pulses. The third transistor M3 in the first subscanning signal output circuit 41_2 provides the signal of the first clock signal terminal CLK1_2 to the first subscanning signal output terminal GOUT1_2 to output a scanning signal gout1_2 having one high-level pulse. Under the action of the second capacitor C2, the signal of the output control node PO_2 is maintained to be the high-level signal, so that the two fifth transistors M5 are both turned on. The fifth transistor M5 in the second subscanning signal output circuit 42_1 provides the signal of the second clock signal terminal CLK2_1 to the second subscanning signal output terminal GOUT2_1 to output a low-level scanning signal gout2_1. The fifth transistor M5 in the second subscanning signal output circuit 42_2 provides the signal of the second clock signal terminal CLK2_2 to the second subscanning signal output terminal GOUT2_2 to output a low-level scanning signal gout2_2.

In the detection reset period T6, VC1 is equal to 1, VC2 is equal to 0, CLK1_1 is equal to 0, and CLK1_2 is equal to 0.

Since VC2 is equal to 0, the twentieth transistor M20 is turned off. Since VC1 is equal to 1, the sixteenth transistor M16 and the seventeenth transistor M17 are turned on, so as to provide the low level of the input signal terminal INPUT to the gate of the nineteenth transistor M19 to control the nineteenth transistor M19 to be turned off. Under the action of the first capacitor C1, the signal of the output control node PO_1 is maintained to be the high-level signal, so that the two third transistors M3 are both turned on. The third transistor M3 in the first subscanning signal output circuit 41_1 provides the low level of the first clock signal terminal CLK1_1 to the first subscanning signal output terminal GOUT1_1 to output a low-level scanning signal gout1_1. The third transistor M3 in the first subscanning signal output circuit 41_2 provides the low level of the first clock signal terminal CLK1_2 to the first subscanning signal output terminal GOUT1_2 to output a low-level scanning signal gout1_2. Under the action of the second capacitor C2, the signal of the output control node PO_2 is maintained to be the high-level signal, so that the two fifth transistors M5 are both turned on. The fifth transistor M5 in the second subscanning signal output circuit 42_1 provides the signal of the second clock signal terminal CLK2_1 to the second subscanning signal output terminal GOUT2_1 to output a low-level scanning signal gout2_1. The fifth transistor M5 in the second subscanning signal output circuit 42_2 provides the signal of the second clock signal terminal CLK2_2 to the second subscanning signal output terminal GOUT2_2 to output a low-level scanning signal gout2_2.

Generally, in the blanking time period, the OLED is subjected to external compensation detection. In this way, the signals G01 and G02 are input into two gate lines in one row respectively through the scanning signals gout1_1 and gout1_2 output by the shift register in Embodiment III, so that the OLED in the row is controlled to realize a display function at the display scanning period in one frame, and is controlled to realize an external compensation detection function at the blanking time period BT. Furthermore, the signals G01 and G02 are input into two gate lines in a next row respectively through the scanning signals gout2_1 and gout2_2, so as to meet the requirements of OLED displaying.

Embodiment IV

The same parts of a shift register provided by Embodiment IV of the present disclosure as those of the shift register provided by Embodiment III are not repeated herein, and only the different parts will be described below.

Figure 12:
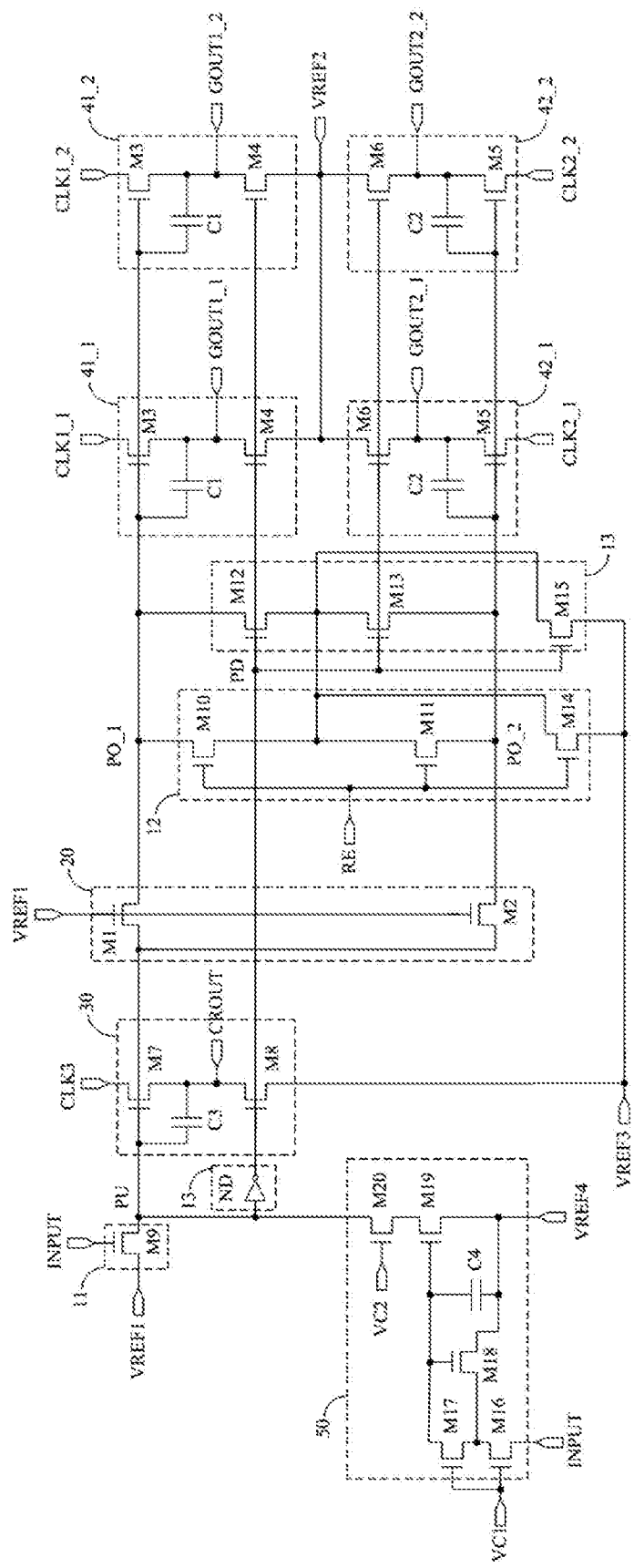
FIG. 12 is another specific schematic structural diagram of a shift register in accordance with an embodiment of the present disclosure.

During specific implementation, two scanning signal output circuits are provided. In the embodiment of the present disclosure, as shown in FIG. 12, the branch control circuit 20 may include: a first transistor M1 and a second transistor M2, wherein a gate of the first transistor M1 is configured to receive the signal of the first reference signal terminal VREF1, a first electrode of the first transistor M1 is coupled to the first node PU, a second electrode of the first transistor M1 is coupled to the output control node PO_1 corresponding to the first scanning signal output circuit. A gate of the second transistor M2 is configured to receive the signal of the first reference signal terminal VREF1, a first electrode of the second transistor M2 is coupled to the first node PU, and a second electrode of the second transistor M2 is coupled to the output control node PO_2 corresponding to the second scanning signal output circuit.

During specific implementation, the first reference signal terminal is a high-level signal in the display scanning period DP and the blanking time period BT. Furthermore, the voltage value of the first reference signal terminal is the same as the voltage value of the first clock signal terminal and the voltage value of the second clock signal terminal. In this way, in the input period T1, when the first node PU is the high-level signal, the voltage value of the gate of the first transistor M1 is the same as the voltage value of the first electrode of the first transistor M1, being equivalent to forming a diode connection structure, and the voltage value of the gate of the second transistor M2 is the same as the voltage value of the first electrode of the second transistor M2, being equivalent to forming a diode connection structure. The rest working process of the input period may be basically the same as the working process of the input period T1 in Embodiment III, and no more details are described herein.

In the output period T2, since the output control signals PO_1-PO_2 are further pulled up, gate-source voltages of the first transistor M1 and the second transistor M2 are higher, which causes the first transistor M1 and the second transistor M2 to be turned off, and thus, the further pulled-up output control signals PO_1-PO_2 can not affect each other through the first node PU, and further, the circuit stability is improved. The rest working process of the output period may be basically the same as the working process of the output period T2 in Embodiment III, and no more details are described herein.

In the reset period T3, the first transistor M1 and the second transistor M2 are turned on all the time. The rest working process of the reset period may be basically the same as the working process of the reset period T3 in Embodiment III, and no more details are described herein.

In the detection input period T4, the detection output period T5, and the detection reset period T6, the first transistor M1 and the second transistor M2 are turned on all the time. The rest working processes of the detection input period T4, the detection output period T5, and the detection reset period T6 may be basically the same as the working processes of the detection input period T4, the detection output period T5, and the detection reset period T6 in Embodiment III, and no more details are described herein.

Based on the same inventive concept, an embodiment of the present disclosure further provides a driving method of the shift register provided by the embodiment of the present disclosure. The driving method drives the shift register according to the embodiment of the present disclosure, so that the shift register may output a plurality of different scanning signals. Furthermore, the implementation of the driving method may refer to the implementation of the above shift register, and repeated parts are not described herein.

Figure 13:
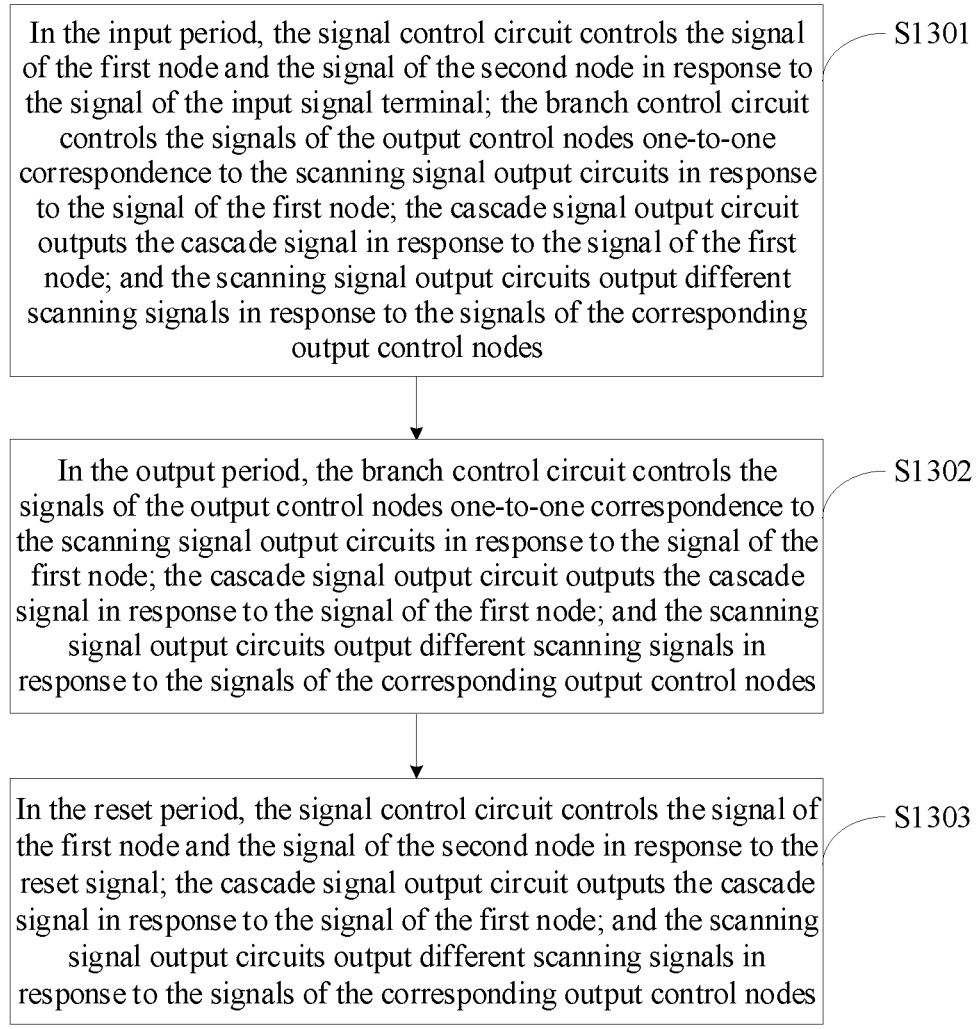
FIG. 13 is a flow diagram of a driving method in accordance with an embodiment of the present disclosure.

During specific implementation, in the embodiment of the present disclosure, a display scanning period may include: an input period, an output period, and a reset period. Specifically, as shown in FIG. 13, the driving method may include the following steps.

S1301, in the input period, the signal control circuit controls the signal of the first node and a signal of the second node in response to the signal of the input signal terminal; the branch control circuit controls signals of output control nodes which one-to-one correspond to scanning signal output circuits in response to the signal of the first node; the cascade signal output circuit outputs the cascade signal in response to the signal of the first node; and the scanning signal output circuits output different scanning signals in response to the signals of the corresponding output control nodes.

S1302, in the output period, the branch control circuit controls the signals of the output control nodes which one-to-one correspond to the scanning signal output circuits in response to the signal of the first node; the cascade signal output circuit outputs the cascade signal in response to the signal of the first node; and the scanning signal output circuits output different scanning signals in response to the signals of the corresponding output control nodes.

S1303, in the reset period, the signal control circuit controls the signal of the first node and the signal of the second node in response to the reset signal; the cascade signal output circuit outputs the cascade signal in response to the signal of the first node; and the scanning signal output circuits output different scanning signals in response to the signals of the corresponding output control nodes.

During specific implementation, two scanning signal output circuits are provided. A first scanning signal output circuit in the two scanning signal output circuits includes a plurality of first subscanning signal output circuits, and the second scanning signal output circuit in the two scanning signal output circuits includes a plurality of second subscanning signal output circuits. It should be noted that the specific description of the part refers to Embodiment I, and no more details are described herein.

In the embodiment of the present disclosure, in the input period and the output period, each first subscanning signal output circuit provides a corresponding first clock signal to a corresponding first subscanning signal output terminal in response to the signal of the corresponding output control node; each second subscanning signal output circuit provides a corresponding second clock signal to a corresponding second subscanning signal output terminal in response to the signal of the corresponding output control node; and the cascade signal output circuit provides a third clock signal to a cascade signal output terminal in response to the signal of the first node.

In the reset period, each first subscanning signal output circuit provides a second reference signal to the corresponding first subscanning signal output terminal in response to the signal of the second node; each second subscanning signal output circuit provides the second reference signal to the corresponding second subscanning signal output terminal in response to the signal of the second node; and the cascade signal output circuit provides a third reference signal to the cascade signal output terminal in response to the signal of the second node.

In the embodiment of the present disclosure, in the display scanning period, signal timing of the first clock signal terminals are the same, signal timings of the various second clock signal terminals are the same, and the signal timings of the first clock signal terminals and the signal timings of the second clock signal terminals are different.

In the embodiment of the present disclosure, signal cycles of the first clock signal terminal, the second clock signal terminal and third clock signal terminal are the same. Furthermore, in the same cycle, the signal rising edge of the third clock signal terminal appears before the signal rising edge of the second clock signal terminal, and the signal falling edge of the third clock signal terminal appears after the signal falling edge of the first clock signal terminal. For example, as shown in FIG. 5, FIG. 8 and FIG. 11, the signal rising edge of the third clock signal terminal CLK3 is aligned with the rising edge of the first clock signal terminal CLK1_*n*, and the signal falling edge of the third clock signal terminal CLK3 is aligned with the signal falling edge of the second clock signal terminal CLK2_*k*.

Further, during specific implementation, the shift register further includes a detection circuit. In this way, the shift register may be applied to an organic light-emitting diode (OLED) display device. In the embodiment of the present disclosure, the driving method may further include: a blanking time period. The blanking time period may include: a detection input period, a detection output period, and a detection reset period. The working processes of the detection circuit in these periods refer to Embodiment III, and no more details are described herein.

Figure 14A:
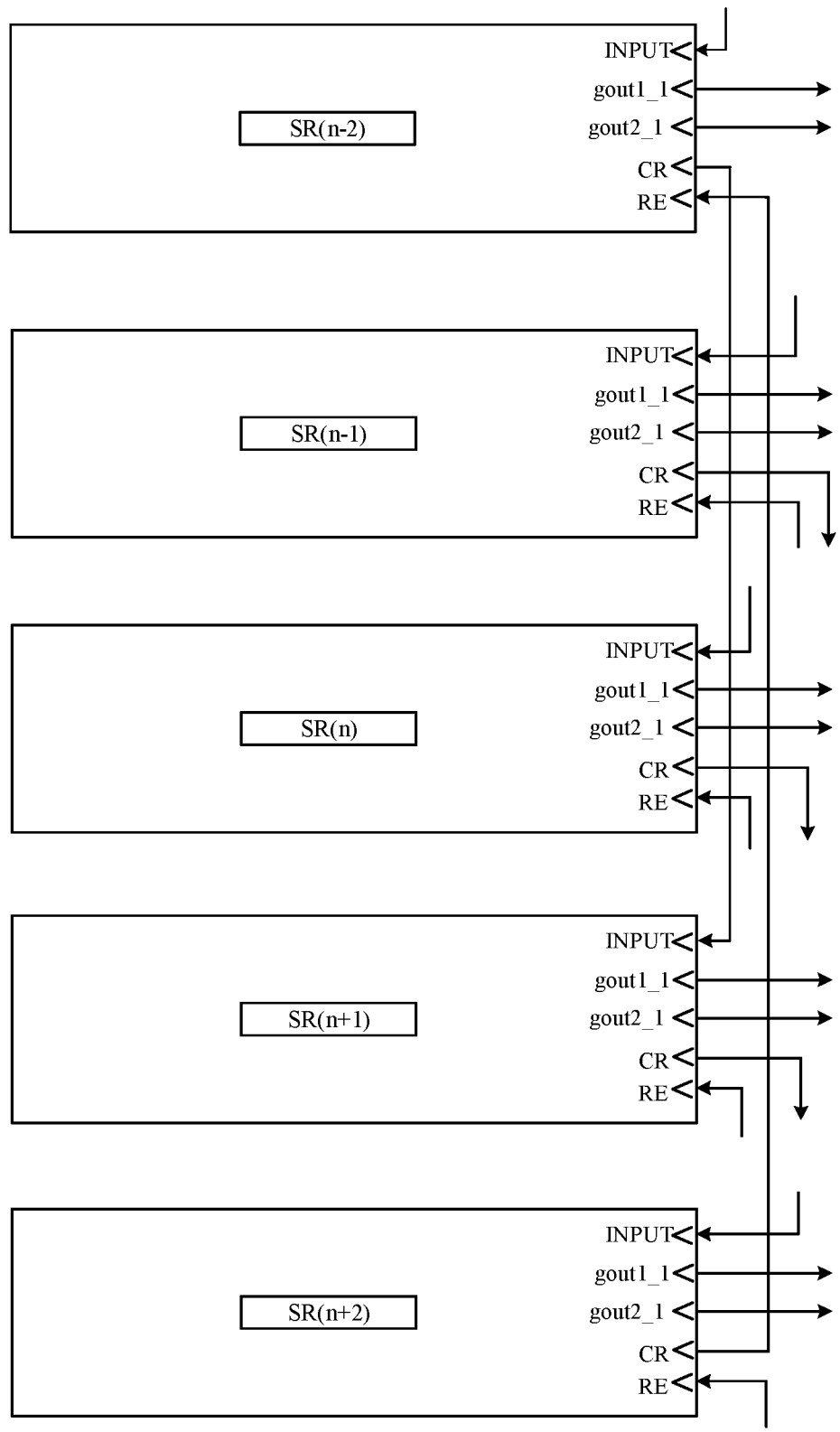
FIG. 14a is a schematic structural diagram of a gate driving circuit in accordance with an embodiment of the present disclosure.
Figure 14B:
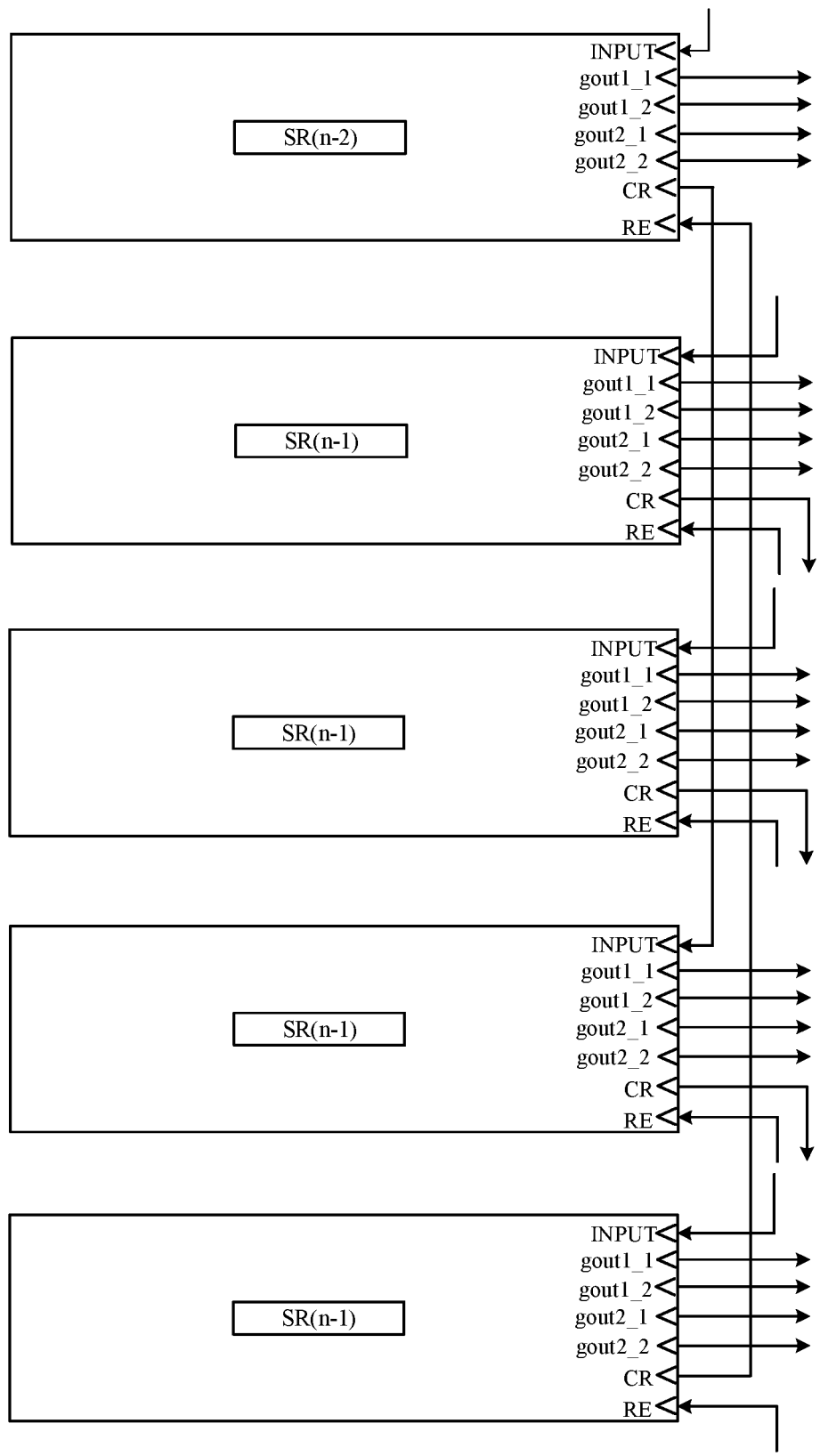
FIG. 14b is another schematic structural diagram of a gate driving circuit in accordance with an embodiment of the present disclosure.

Based on the same inventive concept, an embodiment of the present disclosure further provides a gate driving circuit, as shown in FIG. 14*a* and FIG. 14*b*, including a plurality of the cascaded shift registers according to the embodiments of the present disclosure: SR(n−2), SR(n−1), SR(n), SR(n+1) and SR(n+2) (N shift registers in total, n being an integer more than or equal to 1 and less than or equal to N).

An input signal of a first-stage shift register is input through a frame start signal terminal.

In every four adjacent stages of shift registers, an input signal INPUT of a fourth-stage shift register SR(n+1) is input by a cascade signal CR of the first-stage shift register SR(n−2).

In every five adjacent stages of shift registers, a reset signal RE of the first-stage shift register SR(n−2) is input by a cascade signal CR of a fifth-stage shift register SR(n+2).

It should be noted that FIG. 14*a* illustrates a structure of the shift register by taking the structure shown in FIG. 4 as an example. FIG. 14*b* illustrates a structure of the shift register by taking the structure shown in FIG. 9 as an example.

During specific implementation, when the structure of the shift register uses the structure shown in FIG. 4, a first clock signal terminal CLK1_1 of a (5y−4)th-stage shift register is provided by a same clock signal line clk1_1, a second clock signal terminal CLK2_1 of the (5y−4)th-stage shift register is provided by a same clock signal line clk2_1, and a third clock signal terminal CLK3 of the (5y−4)th-stage shift register is provided by a same clock signal line clk3_1. A first clock signal terminal CLK1_1 of a (5y−3)th-stage shift register is provided by a same clock signal line clk1_2, a second clock signal terminal CLK2_1 of the (5y−3)th-stage shift register is provided by a same clock signal line clk2_2, and a third clock signal terminal CLK3 of the (5y−3)th-stage shift register is provided by a same clock signal line clk3_2. A first clock signal terminal CLK1_1 of a (5y−2)th-stage shift register is provided by a same clock signal line clk1_3, a second clock signal terminal CLK2_1 of the (5y−2)th-stage shift register is provided by a same clock signal line clk2_3, and a third clock signal terminal CLK3 of the (5y−2)th-stage shift register is provided by a same clock signal line clk3_3. A first clock signal terminal CLK1_1 of a (5y−1)th-stage shift register is provided by a same clock signal line clk1_4, a second clock signal terminal CLK2_1 of the (5y−1)th-stage shift register is provided by a same clock signal line clk2_4, and a third clock signal terminal CLK3 of the (5y−1)th-stage shift register is provided by a same clock signal line clk3_4. A first clock signal terminal CLK1_1 of a (5y)th-stage shift register is provided by a same clock signal line clk1_5, a second clock signal terminal CLK2_1 of the (5y)th-stage shift register is provided by a same clock signal line clk2_5, and a third clock signal terminal CLK3 of the (5y)th-stage shift register is provided by a same clock signal line clk3_5, and k is a positive integer.

During specific implementation, when the structure of the shift register uses the structure shown in FIG. 9, the first clock signal terminal CLK1_1 of the (5y−4)th-stage shift register is provided by a same clock signal line clk1_11, a first clock signal terminal CLK1_2 of the (5y−4)th-stage shift register is provided by a same clock signal line clk1_21, the second clock signal terminal CLK2_1 of the (5y−4)th-stage shift register is provided by a same clock signal line clk2_11, a second clock signal terminal CLK2_2 of the (5y−4)th-stage shift register is provided by a same clock signal line clk2_21, and the third clock signal terminal CLK3 of the (5y−4)th-stage shift register is provided by a same clock signal line clk3_1. The first clock signal terminal CLK1_1 of the (5y−3)th-stage shift register is provided by a same clock signal line clk1_12, a first clock signal terminal CLK1_2 of the (5y−3)th-stage shift register is provided by a same clock signal line clk1_22, the second clock signal terminal CLK2_1 of the (5y−3)th-stage shift register is provided by a same clock signal line clk2_12, a second clock signal terminal CLK2_2 of the (5y−3)th-stage shift register is provided by a same clock signal line clk2_22, and the third clock signal terminal CLK3 of the (5y−3)th-stage shift register is provided by a same clock signal line clk3_2. The first clock signal terminal CLK1_1 of the (5y−2)th-stage shift register is provided by a same clock signal line clk1_13, a first clock signal terminal CLK1_2 of the (5y−2)th-stage shift register is provided by a same clock signal line clk1_23, the second clock signal terminal CLK2_1 of the (5y−2)th-stage shift register is provided by a same clock signal line clk2_13, a second clock signal terminal CLK2_2 of the (5y−2)th-stage shift register is provided by a same clock signal line clk2_23, and the third clock signal terminal CLK3 of the (5y−2)th-stage shift register is provided by a same clock signal line clk3_3. The first clock signal terminal CLK1_1 of the (5y−1)th-stage shift register is provided by a same clock signal line clk1_14, a first clock signal terminal CLK1_2 of the (5y−1)th-stage shift register is provided by a same clock signal line clk1_24, the second clock signal terminal CLK2_1 of the (5y−1)th-stage shift register is provided by a same clock signal line clk2_14, a second clock signal terminal CLK2_2 of the (5y−1)th-stage shift register is provided by a same clock signal line clk2_24, and the third clock signal terminal CLK3 of the (5y−1)th-stage shift register is provided by a same clock signal line clk3_4. The first clock signal terminal CLK1_1 of the 5yth-stage shift register is provided by a same clock signal line clk1_15, a first clock signal terminal CLK1_2 of the (5y)th-stage shift register is provided by a same clock signal line clk1_25, the second clock signal terminal CLK2_1 of the (5y)th-stage shift register is provided by a same clock signal line clk2_15, a second clock signal terminal CLK2_2 of the (5y)th-stage shift register is provided by a same clock signal line clk2_25, and the third clock signal terminal CLK3 of the (5y)th-stage shift register is provided by a same clock signal line clk3_5, and k is a positive integer.

During specific implementation, first detection control signals of the various stages of shift registers are a same signal, to control the various stages of shift registers within one frame period. Second detection control signals of the various stages of shift registers are different. Within one frame period, the second detection control signal of only one stage of shift register has a high-level pulse signal, so that the stage of shift register outputs scanning signals gout1_1, gout1_2, gout2_1 and gout2_2 shown in FIG. 11 at the blanking time period. The residual shift registers output low-level signals at the blanking time period.

Specifically, the specific structure of each shift register in the above gate driving circuit is the same as the above shift register of the present disclosure in function and structure, and repeated parts are not described.

Based on the same inventive concept, an embodiment of the present disclosure further provides an array substrate including the above gate driving circuit according to the embodiment of the present disclosure. The principle of the array substrate for solving problems is similar to that of the above gate driving circuit, so that the implementation of the array substrate may refer to the implementation of the above gate driving circuit, and repeated parts are not described herein.

The above array substrate provided by the embodiment of the present disclosure includes the above gate driving circuit, and the various stages of shift registers in the gate driving circuit provide scanning signals to the gate lines on the array substrate. The specific implementation may refer to the description of the above shift register, and the same parts are not described.

Based on the same inventive concept, an embodiment of the present disclosure further provides a display device, including the above array substrate according to the embodiment of the present disclosure. The display device may be any product or component having a display function, such as a mobile phone, a tablet computer, a television, a display, a notebook computer, a digital photo frame and a navigator. Other indispensable components of the display device should be understood by those skilled in the art, are not described repeatedly herein, and should not limit the present disclosure. The implementation of the display device may refer to the embodiment of the above array substrate, and repeated parts are not described.

According to the shift register and the driving method thereof, the gate driving circuit, the array substrate and the display device which are provided by the embodiments of the present disclosure, the signal control circuit controls the signal of the first node and the signal of the second node in response to the signals of the input signal terminal and the reset signal terminal. The branch control circuit is configured to control the signals of the output control nodes one-to-one correspondence to the scanning signal output circuits in response to the signal of the first node, and the different output control nodes may be separated, so that the variation of the signal of one output control node may not affect the signals of other output control nodes. The cascade signal output circuit outputs the cascade signal in response to the signals of the first node and the second node to provide an input signal to the next-stage shift register. A plurality of scanning signal output circuits are arranged, the scanning signal output circuits output different scanning signals in response to the signals of the corresponding output control nodes and the signal of the second node. In this way, each shift register may output a plurality of scanning signals which correspond to different gate lines in the array substrate. Compared with the shift register in the related art, which may only output one scanning signal, the shift register has the advantages that the number of the shift registers in the gate driving circuit may be reduced, the occupation space of the gate driving circuit is reduced, and an ultra-narrow-bezel design is realized. Furthermore, the signals of different output control nodes do not affect each other, so that the stability of the waveforms of the output scanning signals may also be improved, and a difference in the waveforms of the scanning signals is avoided.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

The invention claimed is:
1. A shift register, comprising:
a signal control circuit coupled to an input signal terminal and a reset signal terminal;
a branch control circuit coupled to a first output terminal of the signal control circuit;
a cascade signal output circuit coupled to a cascade signal output terminal and a second output terminal of the signal control circuit; and
at least two scanning signal output circuits, wherein one of the at least two scanning signal output circuits is coupled to the second output terminal of the signal control circuit, at least one corresponding scanning signal output terminal, and one corresponding output terminal of the branch control circuit;
wherein the branch control circuit comprises: a first transistor and a second transistor;

wherein the first transistor is configured to connect the first output terminal of the signal control circuit with a first output terminal of the branch control circuit under control of an active level, and the second transistor is configured to connect the first output terminal of the signal control circuit with a second output terminal of the branch control circuit under control of the active level;

wherein a gate and a first electrode of the first transistor are both coupled to the first output terminal of the signal control circuit, and a second electrode of the first transistor is the first output terminal of the branch control circuit; and a gate and a first electrode of the second transistor are both coupled to the first output terminal of the signal control circuit, and a second electrode of the second transistor is the second output terminal of the branch control circuit.

2. The shift register according to claim 1, wherein the cascade signal output circuit is coupled to the first output terminal of the signal control circuit.

3. The shift register according to claim 2, wherein the at least two scanning signal output circuits comprise two scanning signal output circuits, which are a first scanning signal output circuit, and a second scanning signal output circuit; and the first scanning signal output circuit is coupled to a first output terminal of the branch control circuit, and the second scanning signal output circuit is coupled to a second output terminal of the branch control circuit.

4. The shift register according to claim 3, wherein the first scanning signal output circuit comprises: at least one first subscanning signal output circuit; wherein one first subscanning signal output circuit is coupled to a second reference signal terminal, one corresponding first clock signal terminal, and one corresponding first subscanning signal output terminal; and wherein the second scanning signal output circuit comprises at least one second subscanning signal output circuit, wherein one second subscanning signal output circuit is coupled to the second reference signal terminal, one corresponding second clock signal terminal, and one corresponding second subscanning signal output terminal.

5. The shift register according to claim 4, wherein the first subscanning signal output circuit comprises: a third transistor, a fourth transistor, and a first capacitor;

a gate of the third transistor is coupled to the first output terminal of the branch control circuit, a first electrode of the third transistor is coupled to the first clock signal terminal, and a second electrode of the third transistor is coupled to the corresponding first subscanning signal output terminal;

a gate of the fourth transistor is coupled to the second output terminal of the signal control circuit, a first electrode of the fourth transistor is coupled to the second reference signal terminal, and a second electrode of the fourth transistor is coupled to the corresponding first subscanning signal output terminal; and the first capacitor is coupled between the gate of the third transistor and the first subscanning signal output terminal.

6. The shift register according to claim 4, wherein the second subscanning signal output circuit comprises a fifth transistor, a sixth transistor, and a second capacitor;

a gate of the fifth transistor is coupled to the second output terminal of the branch control circuit, a first electrode of the fifth transistor is coupled to the second clock signal terminal, and a second electrode of the fifth transistor is coupled to the corresponding second subscanning signal output terminal;

a gate of the sixth transistor is coupled to the second output terminal of the signal control circuit, a first electrode of the sixth transistor is coupled to the second reference signal terminal, and a second electrode of the sixth transistor is coupled to the corresponding second subscanning signal output terminal; and the second capacitor is coupled between the gate of the fifth transistor and the second subscanning signal output terminal.

7. The shift register according to claim 3, wherein the cascade signal output circuit comprises a seventh transistor, an eighth transistor, and a third capacitor;

a gate of the seventh transistor is coupled to the first output terminal of the signal control circuit, a first electrode of the seventh transistor is coupled to a third clock signal terminal, and a second electrode of the seventh transistor is coupled to the cascade signal output terminal;

a gate of the eighth transistor is coupled to the second output terminal of the signal control circuit, a first electrode of the eighth transistor is coupled to a third reference signal terminal, and a second electrode of the eighth transistor is coupled to the cascade signal output terminal; and the third capacitor is coupled between the gate of the seventh transistor and the cascade signal output terminal.

8. The shift register according to claim 3, wherein the signal control circuit comprises an input circuit, a reset circuit, and a node control circuit;

the input circuit is coupled to the input signal terminal, the first reference signal terminal, and the first output terminal of the signal control circuit;

the reset circuit is coupled to the reset signal terminal, a third reference signal terminal, and the first output terminal and the second output terminal of the branch control circuit; and the node control circuit is coupled to the third reference signal terminal, the first output terminal and the second output terminal of the signal control circuit, and the first output terminal and the second output terminal of the branch control circuit.

9. The shift register according to claim 8, wherein the input circuit comprises a ninth transistor, wherein a gate of the ninth transistor is coupled to the input signal terminal, a first electrode of the ninth transistor is coupled to the first reference signal terminal, and a second electrode of the ninth transistor is coupled to the first output terminal of the signal control circuit;

the reset circuit comprises a tenth transistor and an eleventh transistor; wherein a gate of the tenth transistor is coupled to the reset signal terminal, a first electrode of the tenth transistor is coupled to the third reference signal terminal, a second electrode of the tenth transistor is coupled to the first output terminal of the branch control circuit;

and a gate of the eleventh transistor is coupled to the reset signal terminal, a first electrode of the eleventh transistor is coupled to the third reference signal terminal, and a second electrode of the eleventh transistor is coupled to the second output terminal of the branch control circuit; and the node control circuit comprises a twelfth transistor, a thirteenth transistor, and an inverter; wherein a gate of the twelfth transistor is coupled to the second output terminal of the signal control circuit, a first electrode of the twelfth transistor is coupled to the third reference signal terminal, and a second electrode of the twelfth transistor is coupled to the first output terminal of the branch control circuit; a gate of the thirteenth transistor is coupled to the second output terminal of the signal control circuit, a first electrode of the thirteenth transistor is coupled to the third reference signal terminal, and a second electrode of the thirteenth transistor is coupled to the second output terminal of the branch control circuit; and an input terminal of the inverter is coupled to the first output terminal of the signal control circuit, and an output terminal of the inverter is coupled to the second output terminal of the signal control circuit.

10. The shift register according to claim 9, wherein the reset circuit further comprises: a fourteenth transistor; wherein the first electrode of the tenth transistor and the first electrode of the eleventh transistor are respectively coupled to the third reference signal terminal through the fourteenth transistor; and a gate of the fourteenth transistor is coupled to the reset signal terminal; and
the node control circuit further comprises: a fifteenth transistor; wherein the first electrode of the twelfth transistor and the first electrode of the thirteenth transistor are respectively coupled to the third reference signal terminal through the fifteenth transistor; and a gate of the fifteenth transistor is coupled to the second output terminal of the signal control circuit.

11. The shift register according to claim 1, wherein the gate of the first transistor is coupled to a first reference signal terminal, the first electrode of the first transistor is coupled to the first output terminal of the signal control circuit, and the second electrode of the first transistor is the first output terminal of the branch control circuit; and
the gate of the second transistor is coupled to the first reference signal terminal, the first electrode of the second transistor is coupled to the first output terminal of the signal control circuit, and the second electrode of the second transistor is the second output terminal of the branch control circuit.

12. The shift register according to claim 1, further comprising: a detection circuit, wherein the detection circuit comprises a sixteenth transistor, a seventeenth transistor, an eighteenth transistor, a nineteenth transistor, a twentieth transistor, and a fourth capacitor;
a gate of the sixteenth transistor is coupled to a first detection control signal terminal, a first electrode of the sixteenth transistor is coupled to the input signal terminal, and a second electrode of the sixteenth transistor is coupled to a first electrode of the eighteenth transistor;
a gate of the seventeenth transistor is coupled to the first detection control signal terminal, a first electrode of the seventeenth transistor is coupled to a gate of the nineteenth transistor, and a second electrode of the seventeenth transistor is coupled to the first electrode of the eighteenth transistor;
a gate of the eighteenth transistor is coupled to the gate of the nineteenth transistor, and a second electrode of the eighteenth transistor is coupled to a fourth reference signal terminal;
a first electrode of the nineteenth transistor is coupled to the fourth reference signal terminal, and a second electrode of the nineteenth transistor is coupled to a first electrode of the twentieth transistor;
a gate of the twentieth transistor is coupled to a second detection control signal terminal, and a second electrode of the twentieth transistor is coupled to the first output terminal of the signal control circuit; and
the fourth capacitor is coupled between the first electrode of the nineteenth transistor and the gate of the nineteenth transistor.

13. A gate driving circuit, comprising a plurality of cascaded shift registers according to claim 1, wherein:
an input signal terminal of a first-stage shift register is coupled to a frame start signal terminal;
in every four adjacent stages of shift registers, an input signal terminal of a fourth-stage shift register is coupled to a cascade signal input terminal of the first-stage shift register; and
in every five adjacent stages of shift registers, a reset signal terminal of the first-stage shift register is coupled to a cascade signal input terminal of a fifth-stage shift register.

14. An array substrate, comprising the gate driving circuit according to claim 13.

15. A display device, comprising the array substrate according to claim 14.

16. A driving method of the shift register according to claim 1, comprising: a display scanning period, wherein the display scanning period comprises an input period, an output period, and a reset period;
in the input period, controlling, by the signal control circuit, a signal of the first output terminal of the signal control circuit and a signal of the second output terminal of the signal control circuit in response to a signal of the input signal terminal; controlling, by the branch control circuit, output signals of the output terminals of the branch control circuit in response to the signal of the first output terminal of the signal control circuit; controlling, by the cascade signal output circuit, the cascade signal output terminal to output a cascade signal in response to the signal of the first output terminal of the signal control circuit; and controlling, by each of the scanning signal output circuits, at least one corresponding scanning signal output terminal to output a different scanning signal in response to a signal of one corresponding output terminal of the branch control circuit;
in the output period, controlling, the branch control circuit, the output signals of the output terminals of the branch control circuit in response to the signal of the first output terminal of the signal control circuit; controlling, by the cascade signal output circuit, the cascade signal output terminal to output the cascade signal in response to the signal of the first output terminal of the signal control circuit; and controlling, by each of the scanning signal output circuits, at least one corresponding scanning signal output terminal to output a different scanning signal in response to a signal of one corresponding output terminal of the branch control circuit; and
in the reset period, controlling, by the signal control circuit, the signal of the first output terminal of the signal control circuit and the signal of the second output terminal of the signal control circuit in response to a signal of the reset signal terminal;
controlling, by the cascade signal output circuit, the cascade signal output terminal to output the cascade signal in response to the signal of the first output terminal of the signal control circuit; controlling, by each of the scanning signal output circuits, at least one corresponding scanning signal output terminal to output a different scanning signal in response to a signal of one corresponding output terminal of the branch control circuit.

17. The driving method according to claim 16, wherein the scanning signal output circuits comprise two scanning signal output circuits, which are a first scanning signal output circuit and a second scanning signal output circuit; the first scanning signal output circuit comprises: a plurality of first subscanning signal output circuits, and the second scanning signal output circuit comprises: a plurality of second subscanning signal output circuits;

in the input period and the output period, providing, by each of the first subscanning signal output circuits, a signal of the corresponding first clock signal terminal to one corresponding first subscanning signal output terminal in response to the signal of the first output terminal of the branch control circuit; providing, by each of the second subscanning signal output circuits, a signal of the corresponding second clock signal terminal to one corresponding second subscanning signal output terminal in response to the signal of the second output terminal of the branch control circuit; and providing, by the cascade signal output circuit, a signal of the third clock signal terminal to the cascade signal output terminal in response to the signal of the first output terminal of the signal control circuit; and in the reset period, providing, by each of the first subscanning signal output circuits, the signal of the second reference signal terminal to the corresponding first subscanning signal output terminal in response to the signal of the second output terminal of the signal control circuit; providing, by each of the second subscanning signal output circuits, the signal of the second reference signal terminal to the corresponding second subscanning signal output terminal in response to the signal of the second output terminal of the signal control circuit; and providing, by the cascade signal output circuit, the signal of the third reference signal terminal to the cascade signal output terminal in response to the signal of the second output terminal of the signal control circuit.

18. The driving method according to claim 17, wherein in the display scanning period, signal timings of the first clock signal terminals are same, and signal timings of the second clock signal terminals are same, and the signal timings of the first clock signal terminals and the signal timings of the second clock signal terminals are different;

wherein signal cycles of the first clock signal terminal, the second clock signal terminal and the third clock signal terminal are the same; and in a same signal cycle, a signal rising edge of the third clock signal terminal appears before a signal rising edge of the second clock signal terminal, and a signal falling edge of the third clock signal terminal appears after a signal falling edge of the first clock signal terminal.

* * * * *